United States Patent
Tan et al.

(10) Patent No.: US 10,298,236 B2
(45) Date of Patent: May 21, 2019

(54) ON-CHIP AGING SENSOR AND COUNTERFEIT INTEGRATED CIRCUIT DETECTION METHOD

(71) Applicant: The Regents of the University of California, Oakland, CA (US)

(72) Inventors: Sheldon Xiangdong Tan, Riverside, CA (US); Kai He, Riverside, CA (US); Xin Huang, Riverside, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 5 days.

(21) Appl. No.: 15/338,170

(22) Filed: Oct. 28, 2016

(65) Prior Publication Data

US 2017/0126229 A1    May 4, 2017

Related U.S. Application Data

(60) Provisional application No. 62/248,145, filed on Oct. 29, 2015.

(51) Int. Cl.
| | |
|---|---|
| *H03K 19/003* | (2006.01) |
| *H01L 23/525* | (2006.01) |
| *G01R 31/28* | (2006.01) |
| *G11C 17/18* | (2006.01) |
| *G01R 31/44* | (2006.01) |

(Continued)

(52) U.S. Cl.
CPC ....... *H03K 19/003* (2013.01); *G01R 31/2858* (2013.01); *G01R 31/44* (2013.01); *G11C 5/005* (2013.01); *G11C 17/18* (2013.01); *G11C 29/022* (2013.01); *G11C 29/025* (2013.01); *G11C 29/1201* (2013.01); *G11C 29/12015* (2013.01); *H01L 23/5252* (2013.01); *G11C 2029/4402* (2013.01)

(58) Field of Classification Search
None
See application file for complete search history.

(56) References Cited

U.S. PATENT DOCUMENTS

| 8,981,810 B1 | 3/2015 | Trimberger et al. |
| 9,083,323 B2 * | 7/2015 | Guo ............ H03K 3/84 |

(Continued)

FOREIGN PATENT DOCUMENTS

| CN | 108474812 A | 8/2018 |
| WO | WO-2017075516 A1 | 5/2017 |

OTHER PUBLICATIONS

"Innovative Sensors for Detection of Counterfeited ICs", UC Case No. 2016-182-1, 2016-357-1, [Online]. [retrieved on Dec. 15, 2016]. Retrieved from the Internet: <URL: https://research.ucr.edu/Archive/TC/Technology/41/2016-182-1,%202016-357-1_SH_Final.pdf>, (Jun. 2016), 1 pg.

(Continued)

*Primary Examiner* — Crystal L Hammond
(74) *Attorney, Agent, or Firm* — Schwegman Lundberg & Woessner, P.A.

(57) ABSTRACT

An on-chip aging sensor and associated methods for detecting counterfeit integrated circuits are shown. In one example, the on-chip aging sensor is integrated within a chip. In one example, the on-chip sensor includes both an on-chip age sensor, and an antifuse memory block including static information unique to the chip.

17 Claims, 18 Drawing Sheets

(51) Int. Cl.
*G11C 5/00* (2006.01)
*G11C 29/02* (2006.01)
*G11C 29/12* (2006.01)
*G11C 29/44* (2006.01)

(56) References Cited

U.S. PATENT DOCUMENTS

| | | | | |
|---|---|---|---|---|
| 9,564,883 B1* | 2/2017 | Quinton | ............... | H03K 5/13 |
| 9,564,884 B1* | 2/2017 | Quinton | ............... | H03K 5/13 |
| 9,880,892 B2* | 1/2018 | Bickford | ............... | H01L 22/10 |
| 2008/0217614 A1* | 9/2008 | Cranford | ............ | G01R 31/2858 257/48 |
| 2010/0153954 A1* | 6/2010 | Morrow | ............... | G06F 1/329 718/102 |
| 2011/0173432 A1* | 7/2011 | Cher | ............... | G01R 31/31725 713/100 |
| 2011/0219208 A1* | 9/2011 | Asaad | ............... | G06F 15/76 712/12 |
| 2012/0153279 A1* | 6/2012 | Kim | ............... | G01R 31/2856 257/48 |
| 2012/0158392 A1* | 6/2012 | Kim | ............... | G01R 31/2856 703/13 |
| 2014/0022008 A1* | 1/2014 | Noorlag | ............... | G06F 1/26 327/540 |
| 2014/0097856 A1* | 4/2014 | Chen | ............... | G01R 31/2884 324/617 |
| 2014/0225639 A1* | 8/2014 | Guo | ............... | H03K 3/84 326/8 |
| 2015/0130506 A1* | 5/2015 | Bhunia | ............... | G11C 17/16 326/8 |
| 2015/0241511 A1* | 8/2015 | Bickford | ............... | H01L 22/10 702/117 |
| 2016/0178694 A1* | 6/2016 | Fry | ............... | G01C 22/00 324/762.03 |
| 2018/0097712 A1* | 4/2018 | Andrade Costa | ..... | H04L 41/147 |
| 2018/0143243 A1* | 5/2018 | Dietz | ............... | G01R 31/2858 |

OTHER PUBLICATIONS

"International Application Serial No. PCT/US2016/059557, International Search Report dated Jan. 3, 2017", 2 pgs.

"International Application Serial No. PCT/US2016/059557, Written Opinion dated Jan. 3, 2017", 7 pgs.

Schmid, Thomas, et al., "On the Interaction of Clocks, Power, and Synchronization in Duty-Cycled Embedded Sensor Nodes", *ACM Transactions on Sensor Networks*, vol. 7, No. 3, Article 24, (Sep. 2010), 24:1-24:19.

"International Application Serial No. PCT/US2016/059557, International Preliminary Report on Patentability dated May 11, 2018", 9 pgs.

* cited by examiner

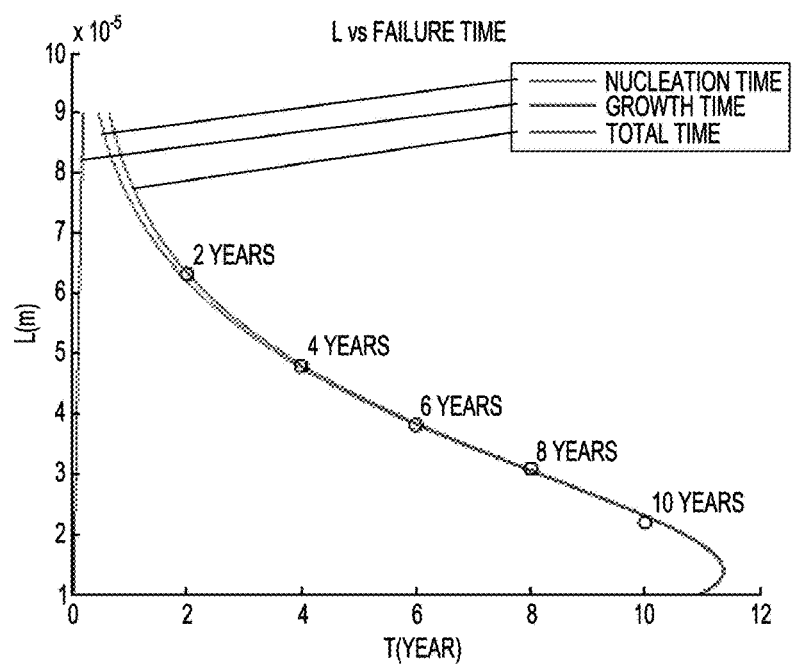
FIG. 5
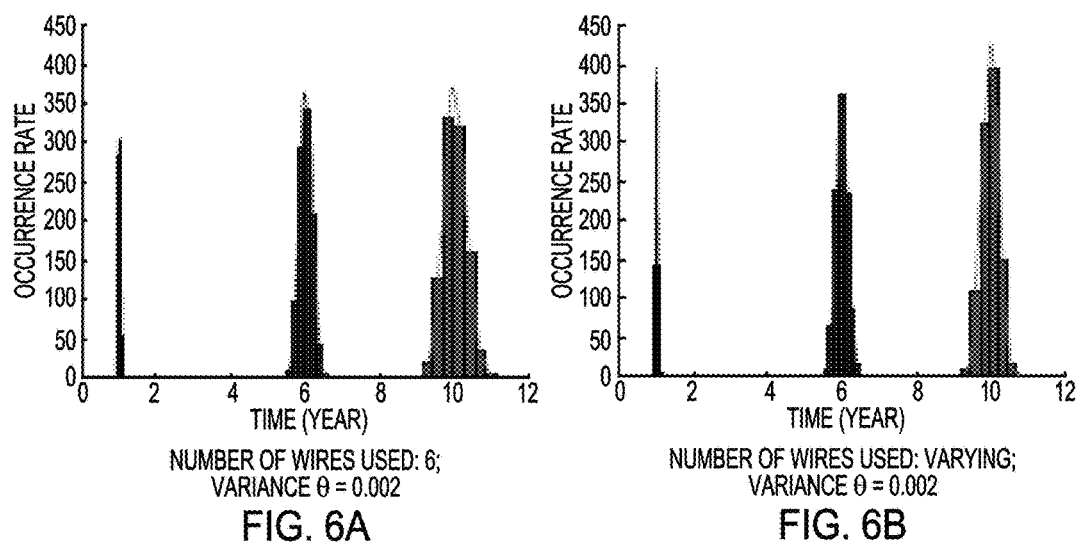
FIG. 6A
FIG. 6B

7-STAGE RO WITH PV0

7-STAGE RO WITH PV1

15-STAGE RO WITH PV0

15-STAGE RO WITH PV1

1 WIRES

3 WIRES

6 WIRES

10 WIRES

ON-CHIP AGING SENSOR AND COUNTERFEIT INTEGRATED CIRCUIT DETECTION METHOD

RELATED APPLICATION

This application claims priority to U.S. Provisional Patent Application No. 62/248,145, entitled "EM-BASED ON-CHIP AGING SENSOR FOR DETECTION AND PREVENTION OF RECYCLED ICS," filed on Oct. 29, 2015, which is incorporated herein by reference in its entirety.

TECHNICAL FIELD

This invention relates to integrated circuit on-chip aging sensing systems and counterfeit integrated circuit detection methods.

BACKGROUND

Improved integrated circuit on-chip aging sensing systems and counterfeit integrated circuit detection methods are desired.

BRIEF DESCRIPTION OF THE DRAWINGS

FIG. 5 shows statistical lifetime detections from stressed wires: (a) using a constant 6 wires; (b) using a varying number wires (6 wires for 1 year, 10 wires for 6 years, and 14 wires for 10 years) according to an example of the invention.

FIGS. 6A-6B show length versus EM lifetime of a wire data according to an example of the invention.

DETAILED DESCRIPTION

Figure 1:
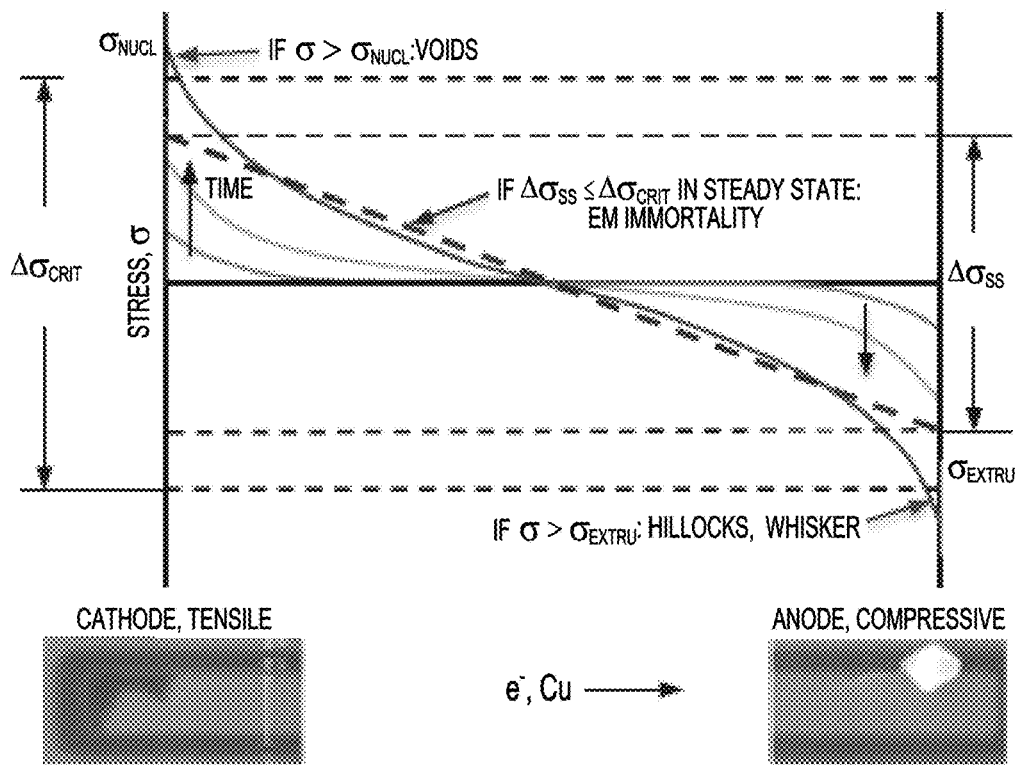
FIG. 1 shows EM-induced stress development and distribution of an interconnect wire according to an example of the invention.

In the following detailed description, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, or logical changes, etc. may be made without departing from the scope of the present invention.

The counterfeiting and recycled integrated circuits (ICs) has become a major security threat for commercial and military systems. In addition to the huge economic impacts, they post significant security and safety threats on those systems. In this paper, we propose a new lightweight on-chip aging sensor, which is based on the electromigration (EM)-induced aging effects for fast detection and prevention of recycled ICs. An EM-based aging sensor exploits the natural aging/failure mechanism of interconnect wires to time the aging of the chip. Compared with existing aging sensor, the new aging sensor can provide more accurate prediction of the chip usage time at smaller area footprints due to its simple structure. The new sensor is based on a newly proposed physics-based stress evolution model of EM effects for accurate prediction of the EM failure. As a result, we can design the interconnect wire structures based on copper interconnect technology so that the resulting wires will have detectable EM failure at a specific time with sufficient accuracy. In order to mitigate the problem of the inherent variations in the metal grain sizes and assess its impacts on the nucleation time of metal wires, a number of parallel properly structured wires are used in the sensor. The parameters of the wires are optimized using the new EM model. Our statistical and variational analysis shows that the proposed aging sensor can accurately predict the targeted failure times in the presence of both inherent uncertainties. Our study also shows that more parallel wires will lead to more accurate statistical predictions at costs of more areas.

The counterfeiting and recycling of integrated circuits (ICs) have become major problems in recent years, potentially impacting the security of electronic systems especially for military, aerospace, medical and other critical applications. In addition to diminishing system dependability and usability, counterfeiting reduces total revenue of companies from their research and development efforts, discourages innovation through the theft of intellectual properties (IPs), and produces low-quality products under established brand names. A counterfeit component is defined as an electronic part that is not genuine because it is an unauthorized copy; it does not conform to the original component manufacturer's (OCM) design, model, and/or performance; or it is not produced by the original component manufacturer or is produced by unauthorized contractors; it is an off-specification, defective, or used OCM product sold as "new" or working; it has incorrect or false markings and/or documentation counter, which counts the clocks or derivatives of the clock events to log the usage of the chip. The antifuse memory is used to make sure the data in the count will not be erased or altered by attackers. However, the AF-based sensors suffer large area overhead especially when more accurate usage is required. Another problem with this method is that it may not reflect the true aging-dependent usage of a chip. For instance, it will log the same usage time for a chip for different on-chip temperatures, however, which can have dramatically impacts on the aging effects from electromigration, NBTI and HCI.

A new lightweight on-chip aging sensor is shown, which is based on the electromigration-induced aging effects for fast detection and prevention of recycled ICs. Instead of using traditional aging effects from devices (such as MOSFETs), the new EM-based aging sensor exploits the natural aging/failure mechanism of interconnect wires to time the aging of the chip. As a result, compared with existing the ring-oscillator-based aging sensor, it has following two advantages: First, this structure is much simpler as it only requires metal interconnect wires, which was driven by DC currents. In comparison, the ring oscillator has to be used to detect the threshold voltage shift. Second, it is more accurate as we can measure the EM-induced failure (such as wire resistance changes) time with more accurate than the frequency shift over time. The new sensor is based on a newly proposed hydrostatic stress evolution model of EM effects for accurate prediction of the EM failure [10]. As a result, we can design the interconnect wire structures based on the copper interconnect technology so that the resulting wires can have detectable EM failure at a specific time with sufficient accuracy. In order to mitigate the problem of the inherent variations in the metal grain sizes and assess its impacts on the nucleation time of metal wires, a number of parallel properly structured wires are employed in the sensor. The parameters of the wires are optimized with using the new EM model. Our experimental results show that the proposed aging sensor can accurately predict the targeted failure times in the presence of both inherent uncertainties. Our study also shows that more parallel wires will lead to more accurate statistical predictions at costs of more areas.

The section below reviews the EM effect and recently proposed physics-based EM model. In Section III, we present the new lightweight on-chip aging sensor circuit as well as the interconnect wire structures. Several statistical and variational analyses are presented in Section IV. Last, Section V concludes.

Review of EM-Induced Failure Effects

The proposed on-chip aging sensor is based on the observa-tion that the EM-induced failure of interconnect wires can be designed such that the wires can fail at a specific time frame detected by the increase of their resistances over a pre-defined threshold. To understand this, let's first have a brief review of the EM failure effects from the first principles and then we present the problems and solutions to design the wire structure for timed failure based on EM physics.

EM is a physical phenomenon of the migration of metal atoms along a direction of the applied electrical field. Atoms (either lattice atoms or defects impurities) migrate toward the anode end of the metal wire along the trajectory of conducting electrons. This oriented atomic flow, which is caused mostly by the momentum exchange between atoms and the conducting electrons, results in metal density depletion at the cathode, and a corresponding metal accumulation at the anode ends of the metal wire. This depletion and accumulation happen because atoms cannot easily escape the metal volume.

The interconnect segment here means a continuously connected, highly conductive metal within one layer of metallization, terminated by diffusion barriers. Thin layers of refractive metals form these diffusion barriers for Cu atoms, preventing them from diffusing into inter-layer (ILD) and inter-metal dielectrics (IMD). When metal wire is embedded into a rigid confinement, which is the case with interconnect metallization, the wire volume changes (induced by the atom depletion and accumulation due to migration) creating tension at the cathode end and compression at the anode ends of the line. Over time, the lasting unidirectional electrical load increases these stresses, as well as the stress gradient along the metal line. FIG. 1 shows the stress evolution in a straight wire over time. The cathode node has the tensile stress (positive stress) built up, while the anode node has compressive stress generated (negative stress). In some cases, usually when a line is long, this stress can reach a critical level, resulting in void nucleation at the cathode and/or hillock formation at the anode end of line as shown in FIG. 1. Different physical mechanisms can be responsible for generating these damages. In the case of voiding, existing cohesive or interfacial micro-cracks near or at the barrier/Cu interfaces can develop into a void by the action of the appropriate stresses. Hillock formation, which is a compression-induced extrusion of metal into the surrounding dielectric that can cause a shortage between neighboring metal lines, can be initiated by micro-cracks in the adhesion/barrier layers. However, typically the voids are the major defects from EM.

One important observation of EM effects is that the time to failure (TTF) of a wire show some degree of randomness. This TTF represents the instant in time when an increase in line electrical resistance caused by the void growth reaches a critical level (for example, a 10% increase over the original value). The reason is that the grain boundaries (GB) of metal wires has random sizes and orientations, which lead to variations in the atomic diffusivities. Actually the EM-induced TTF follows the lognormal distribution. This inherent uncertainty in TTF is one of the challenges to designing accurate aging sensor.

Physics-Based EM Model

Traditionally the EM effects are modeled by the semi-empirical Black's equation. However, Black's equation suffers several problems for accurate TTF estimation. The major drawback of this model is that it fails to consider impacts of wire length and residual stresses.

Recently, more accurate and physics-based EM model has been proposed [12], [10]. In this model, the EM kinetics consists of two phases: (1) the void nucleation phase and (2) the void growth phase. In the nucleation phase, the void nucleation time ($t_{nuc}$) can be computed as follows:

$$t_{nuc} \approx \tau^* e^{\frac{E_V}{kT}} e^{-\frac{f\Omega}{kT}\left(\sigma_{Res} + \frac{eZ\rho l}{4\Omega}j\right)} \ln\left\{\frac{\frac{eZ\rho l}{4\Omega}j}{\sigma_{Res} + \frac{eZ\rho l}{4\Omega}j - \sigma_{crit}}\right\} \text{ where} \quad (1)$$

$$\tau^* = \frac{l^2}{D_0} e^{\frac{E_D}{kT}} \frac{kT}{\Omega B}.$$

Here, $E_V$ and $E_D$ are the ac-tivation energy of vacancy formation and diffusion, f is the ratio of volumes occupied by vacancy and lattice atom. In this model, we consider the residual stress of σRes=σT+(B/9)(R/δ)exp{-E_v/kT_ZS} when electrical stressing was applied. Here, σT is the thermal stress developed in the metal line confined in the ILD/IMD dielectric during cooling from the zero stress temperature $T_{ZS}$ down to the temperature of use condition, $(B/9)(R/δ)exp\{-E_v/kT_{ZS}\}$ is an additional stress generated by vacancy relaxation to the equilibrium concentration corresponding to new stress value and temperature, R is the mean grain size, and δ is the GB thickness. Dependence of $t_{nuc}$ on grain size allows one to introduce a simple statistical model for void nucleation at the line cathode edge.

Note that the nucleation time $t_{nuc}$ is also function of the wire length l, which is totally ignored in the existing EM models. We further note that in the new physics-based EM model, one needs to explicitly consider the residual stresses, σRes, which can have huge impacts on the nucleation time and thus the failure time of a wire. As a result, it is important to have an accurate estimation of residual stresses and more accurate residual stress can be computed using multi-scale numerical method.

In the second growth phase, void starts to grow and wire resistance starts to change. Kinetics of the wire resistance change can be approximately described as:

$$\Delta r(t) = \vartheta(t - t_{nuc}) \left[ \frac{\rho_{Ta}}{h_{Ta}(2H+W)} - \frac{\rho_{Cu}}{HW} \right] \quad (2)$$

Here $\rho_{Ta}$ and $\rho_{Cu}$ are the resistivity of the barrier material (Ta/TaN) and copper, W is the line width, H is the copper thickness, and $h_{Ta}$ is the barrier layer thickness.

$$\vartheta = \frac{D}{kT} \overline{eZ} \rho j$$

is the drift velocity of the void edge.

Proposed EM-Based Aging Sensor Circuit

Wire Structure for Accurate EM-Induced Aging Detection

In the section, we investigate the new wire structures so that we can have more accurate detection of the EM induced resistance changes based on the new physics-based EM models. There are several factors we need to consider to design the right interconnect wire structures as the critical component of the aging sensors. First, there are the inherent variations in the metal wires, which will lead to the uncertainties in the nucleation time and the growth time. For a metal wire, its grain boundaries (GBs) may have different crystallographic orientations, which are characterized by different atomic diffusivities. Second, the grain sizes have a random distribution. As a result, the lifetime of the metal wires obeys the lognormal distributions. Hence, we cannot use only one metal wire as the aging sensor. Third, how to design the geometry of the wires (length and width) to have a small area and power overhead for the sensors. We want the sensors to have a small footprint with considering their power consumptions and areas. In addition, they will meet the design rules, which are compatible with given design technologies. Fourth, we need to have an accurate estimation of the residual stresses $\sigma_{Res}$ (mainly the thermal stresses), which largely depend on the temperature of the manufacturing process and even the packaging process.

Figure 2:
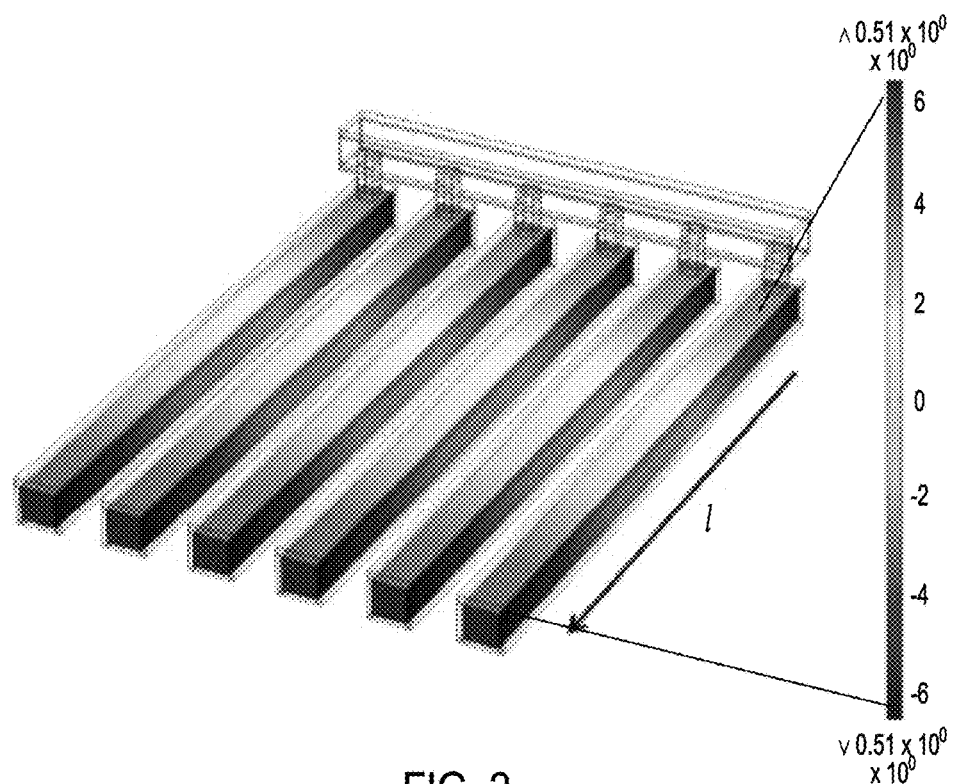
FIG. 2 shows parallel multi-wire structure for an aging sensor and its stressed condition according to an example of the invention.

In order to mitigate the inherent uncertainties in the atomic diffusivities in a metal line, one solution is to use a number of wires connected in parallel as shown in FIG. 2, in which each wire will have its own diffusion barriers at both ends (so they are treated as individual wires in the EM sense). However, they are connected in parallel by another metal layer through vias. The color in the figure shows the simulated stress distributions in each wire. Those wires will be stressed all the time (with constant current running through them). We can design the wires such that they will fail at a specific time such as one year, two years, . . . , or n years. Assume that the resistance value of the stressed wire at t=0 is r0. The failure time can be defined as the time when the wire resistance increases 10% of its values, i.e. 1.1*r0, which can be predicted by the physics-based EM model. We also need to design a reference wire, which is not normally stressed (unless its resistance value is read during the detection time). The resistance value of the reference wire should be set to 1.1*r0/k, k is the number of wires in the stressed wire set. For the reference wire, we only need one wire segment as it will not age (the uncertainties in the EM-induced aging will not affect it). Our preliminary study shows that depending on the inherent variations, we can determine the number of wires such that we can confine the lifetime variations to a sufficient small range. The exact number wires used will be explored and validated by the actual silicon data. We remark that the intra-die process variations will affect the resistance values of those wires. However, if they are placed very closely, as this should be the case, the impacts will not be significant.

Resistance Detection Sensor Circuit

Figure 3:
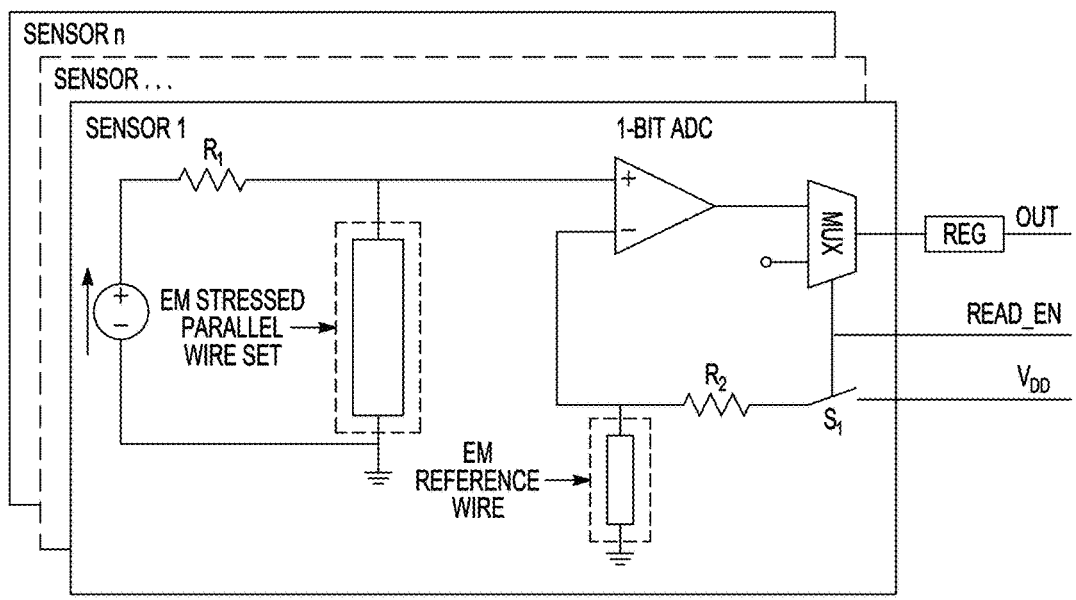
FIG. 3 shows the structure of an EM-based aging sensor according to an example of the invention.

FIG. 3 shows the schematic of the proposed EM-based aging sensor circuit. The circuit is composed of a constant current source, an EM stressed parallel wire (EMS) set, an EM reference wire (EMR), which will not be stressed in normal operation, a one-bit ADC (essentially an Opamp circuit), two resistors, one multiplex (MUX), one switch and one register to store the sensor digital output. The EMS contains a number of parallel wires (such as 6 in our initial analysis) with identical geometries. The EMR is just a single wire. The constant current source provides the current to stress EMS when the power is on. The one-bit ADC is used as a comparator to decide if the stressed EMS has a larger resistance than the EMR. If the voltage on EMS is higher than the voltage on EMR, it outputs 1, which indicates the failure happens, otherwise 0, which indicates that failure has not happened yet. The MUX and the switch are controlled by the Read en signal from outside. When Read en is off, the output of one-bit ADC will not be read into the register and the there is no current on EMR as it is in an open circuit. When Read en is on, there will be a voltage on EMR, which is 10% higher than the original voltage on EMS and the comparison result from one-bit ADC can be written into the register. As time going, the resistance of the EMS will increase due to the EM effect, which means the voltage of the non-inverting input of the one-bit ADC will increase. If the chip has been used for time longer than the designed failure time, the output of one-bit ADC will be 1 instead of 0.

We will design a number of such aging sensors for the specific years (for instance 1 year to 10 years) in this project for validation purpose. Similar to the other on-chip aging sensors, the output registers can be connected by the JTAG circuits of the chip design so that one can read the aging information out in-situ during the testing or diagnosis time. The aging information can also be read out before the chips are put into the system. Note that the proposed EM-based sensor can automatically consider the temperature impacts on the lifetime of the chips as it is based on the EM aging effects.

Performance Analysis and Experimental Results

Figure 4A:
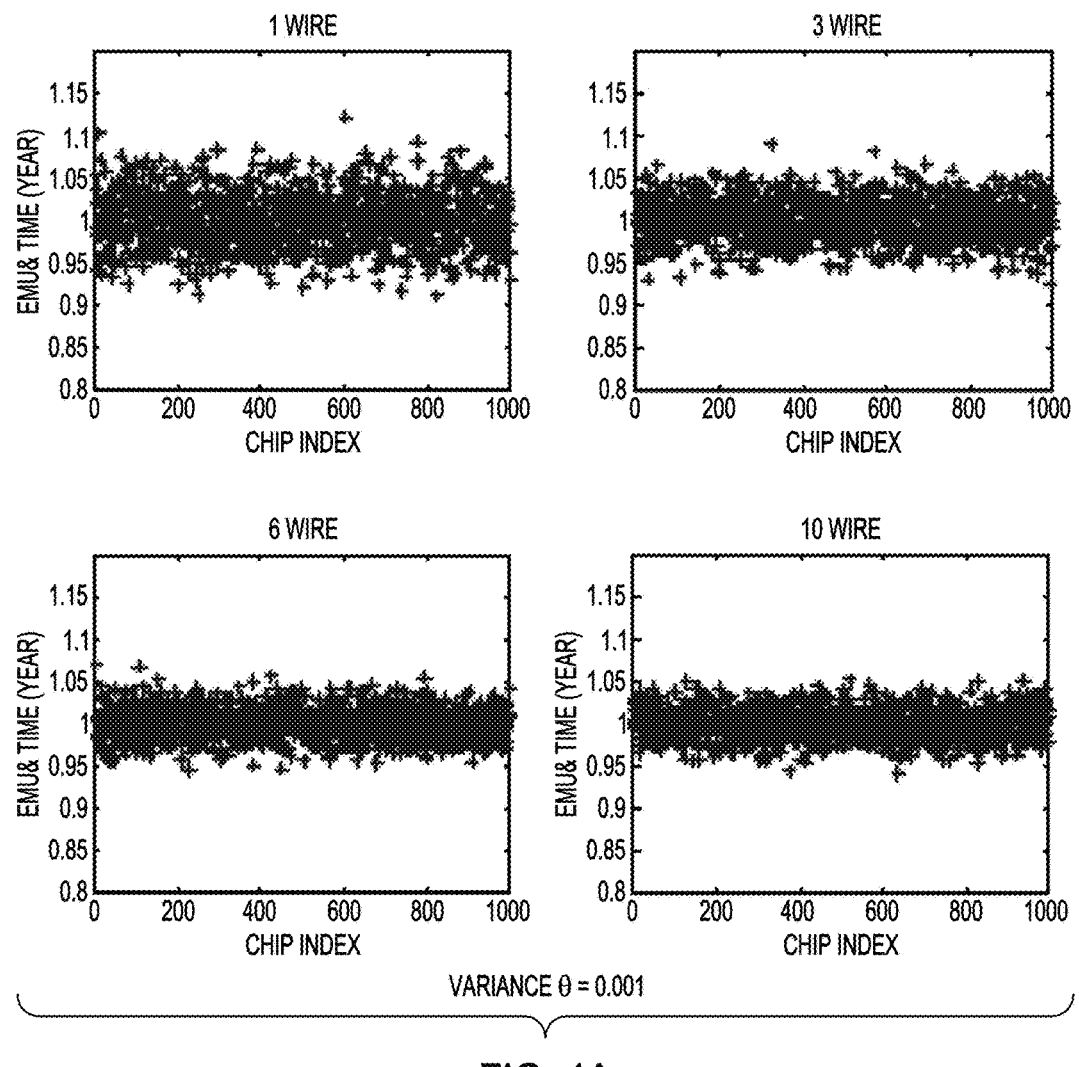
FIGS. 4A-4B show a statistical study of stressed wires connected in parallel with different wire numbers and variations according to an example of the invention.
Figure 4B:
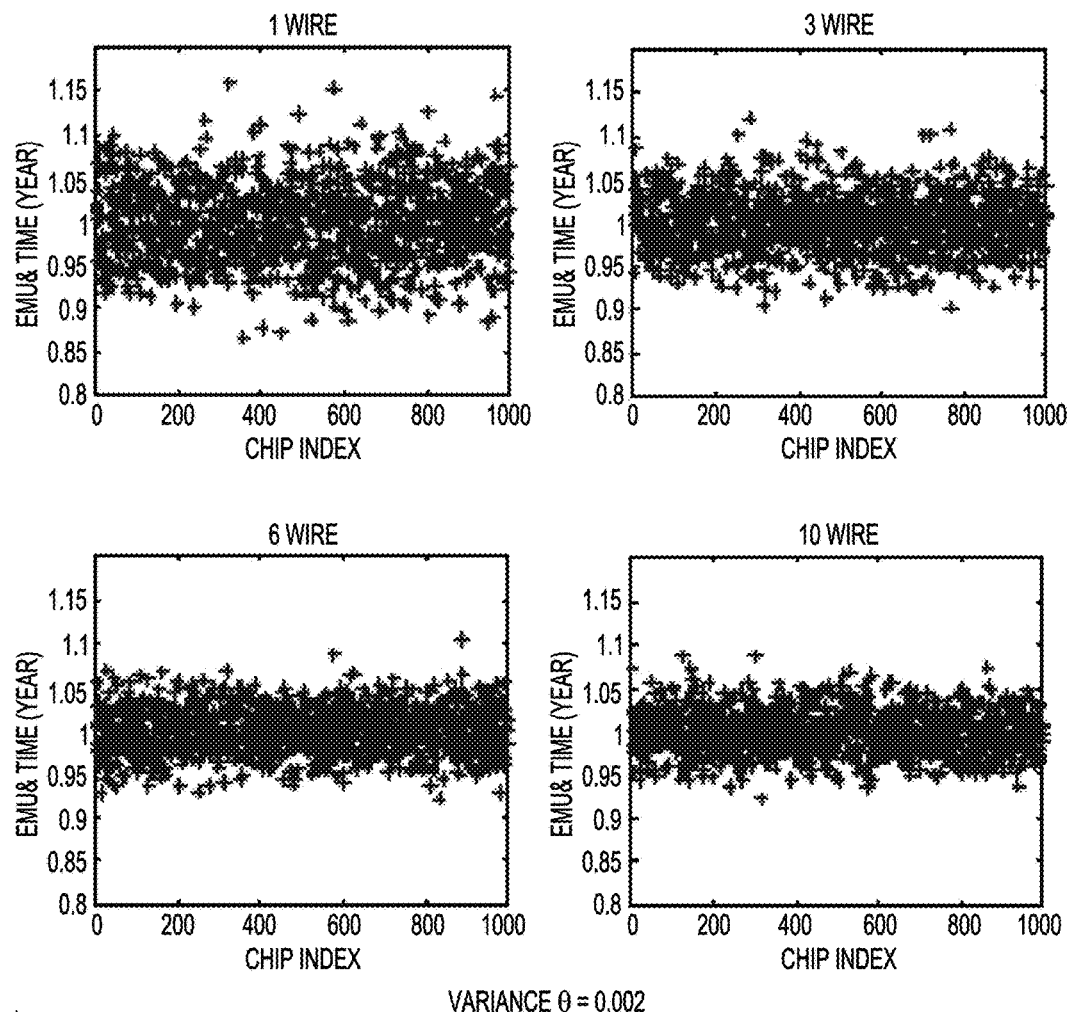

In this section, we will present the performance analysis of the proposed EM-based aging sensor including simulation results. For the proposed EM-based aging sensor, if the inherent variations are same for all the wires, then the wire (wire set), which fails at longer time, will have less absolute accuracy. For instance, 10% life time variation for a one-year wire will have an accuracy of about one month. While 10% lifetime variation for 10-year wire will lead to errors about one year. In order to mitigate this problem, one solution is to add more parallel wires for longer year wire set. Because more parallel wires we have, the smaller lifetime deviation the whole wire set will have. FIG. 4(a) and FIG. 4(b) show statistical analysis results for EM lifetime of stressed wire set connected in parallel versus number of wires in each set and different variations. These results come from 1000 Monte Carlo simulation runs and the aging sensor wires are set for the one-year lifetime. The EM-induced lifetime follows the lognormal distribution and the variance are set to 0.001 and 0.002 respectively for the two figures. With 0.001 variance, we can see that with one wire, the EM lifetime will fall into ±10% lifetime mean with 99.83% chance and into ±5% lifetime mean with 88.64% chance. If we use 6 wires, we can have 100% chance to achieve ±10% life mean and 98.66% chance for ±5% life mean, which is good enough. If we increase the variance to 0.002, then one wire can reach 97.46% chance for ±10% life time mean; 6 wires can achieve 99.95% chance for ±10% lifetime mean and 92.00% chance for ±5% lifetime mean. For 10 wires, we can achieve 990.99% chance for ±10% lifetime mean and 95.33% chance for ±5% lifetime mean. As we can see, with large inherent variations, we have to increase the number of wires to mitigate to reduce lifetime variations. We remark that the intra-die environmental variations will also affect the resistance values of those wires. However, if they are placed very closely, as this should be the case, the impacts will not be significant.

FIG. 5 studies the lifetime variations versus the number of parallel wires used in each wire set for specific years (1 year, 6 years, 10 years). If we use the constant 6 wires for each set as shown in FIG. 6(a), we can see that the lifetime prediction variations in the 10-year wire set is quite significant for given variance ($\theta$=0.002). But if we use varying numbers of wires for the same design (6 wires for 1 year, 10 wires for 6 years, and 14 wires for 10 years), the variations for the wire sets at the longer time lifetimes will be reduced as shown in FIG. 6(b).

Effect of Length of Wires

Figure 7:
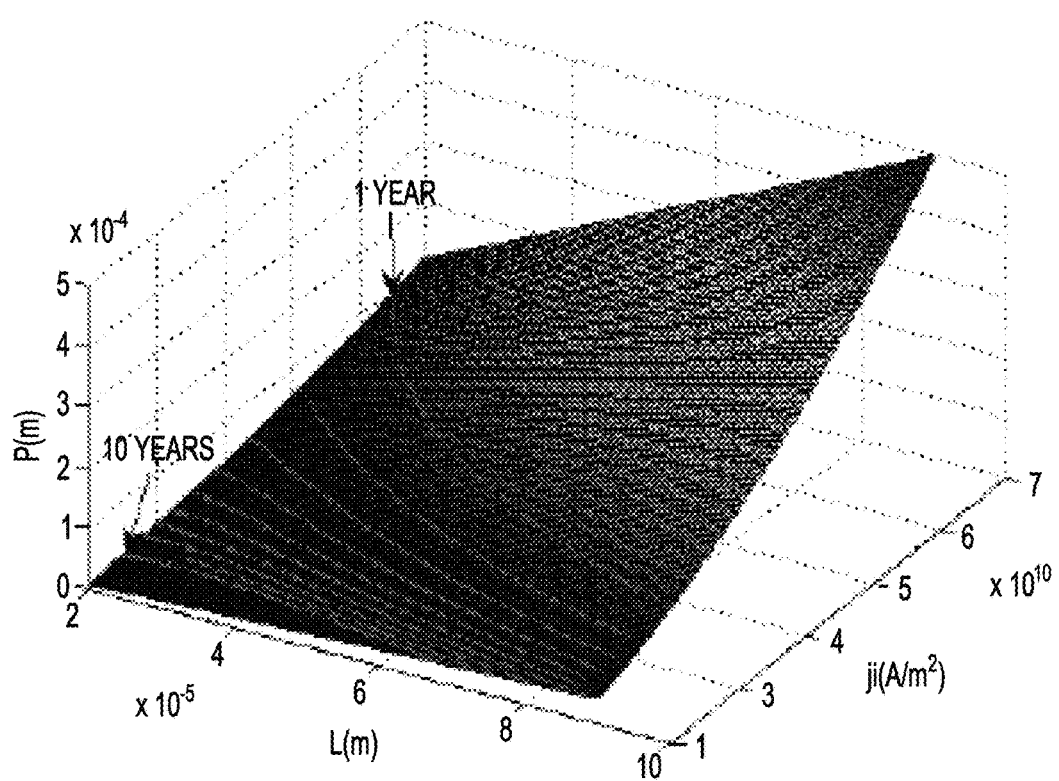
FIG. 7 shows power consumption of stress wires versus wire length and current density data according to an example of the invention.

FIG. 7 shows the relationship between wire length L and wire EM lifetime. The current density j is constant and set to $3*10^{10}$ A/m$^2$. We show both the nucleation time and the growth phase time predicted by the new EM models. As we can see, the total lifetime increases with decreasing L (so does the area), which shows that shorter failure time will need larger area compared to the longer failure time.

For a specific failure year designed, the area for the sensor wires can be estimated as A=W*L*k, where W is the width of each stressed wire (assuming that all the stressed wire are same) and L is the length of the stressed wire. The area of reference wire is 1.1*W*L/k, which is typically less significant compared to stressed wires. The power consumption for total stressed wires can be estimated as P=k*I$^2$*R=k* (j*A)$^2$*$\rho$*L/A=k*j$^2$*L*$\rho$*A=k*j$^2$*L*$\rho$*W*H, where $\rho$ is the resistivity of the metal wire, j is current density, and H is the height of the wire segment as shown in FIG. 2. From the two formulas above, we can see that we should try to use the minimum width allowed by the technology node to save both area and power in theory. Our initial study shows that area and power are two performance metrics for trading-off in the design. FIG. 7 shows the power values versus the possible wire length (L) and current density j. The 10 red curves show the possible L and j values from 1 year to 10 years. We can clearly see the trade-off between L (area) and power.

Bear in mind that tens of EM-based aging sensor can be inserted into commercial chips, which would easily detect the counterfeit and recycled ICs and show the age of the chip. Such a method is practical because the area overhead is small. An EM-based aging sensor with 10 stressed wires costs 100-500 um$^2$ with an SMIC 180 nm technology, which depends on the length of the wire. Assuming a total of 10 sensors, the overhead is only 0.02% of the 25,000,000 um$^2$ area available in a 5 mm×5 mm chip.

Experimental Results

The proposed EM-based aging sensor circuit has been designed and validated using SPICE simulation. We performed 1000 Monte-Carlo simulation runs considering the variation of the nucleation time for the stressed wires. We design the wires such that they will fail (its resistance increase just 10%) around one year with lognormal distribution (standard deviation is set to 0.001) in their nucleation times.

Figure 8A:
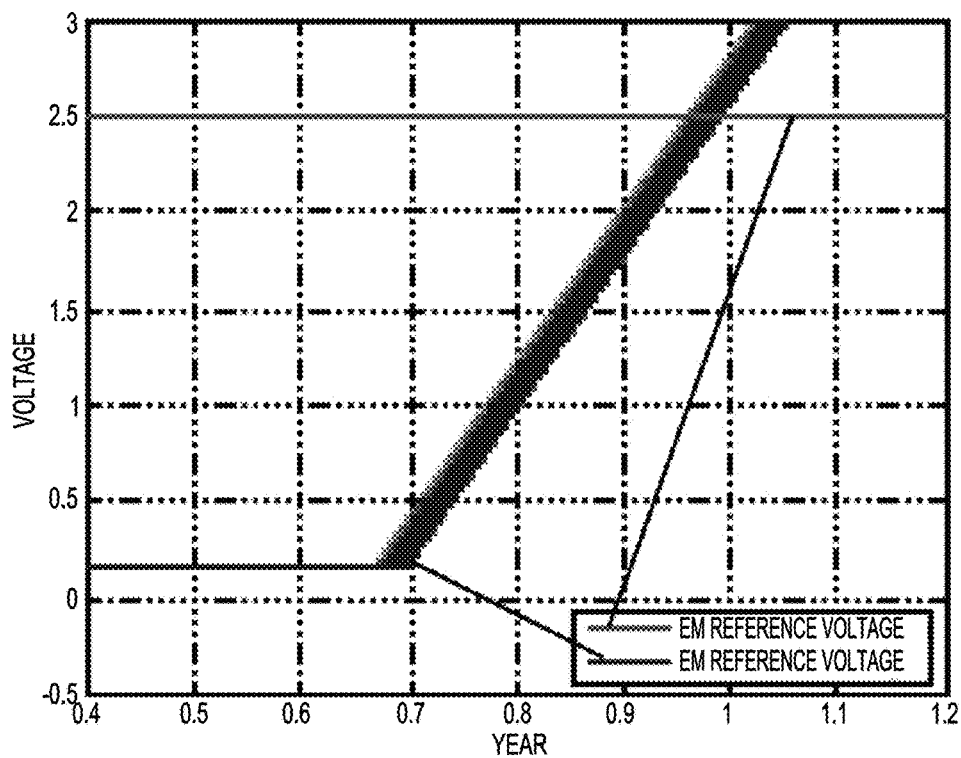
FIGS. 8A-8B show (a) statistical voltage inputs for an ADC and (b) the statistical ADC output data according to an example of the invention.
Figure 8B:
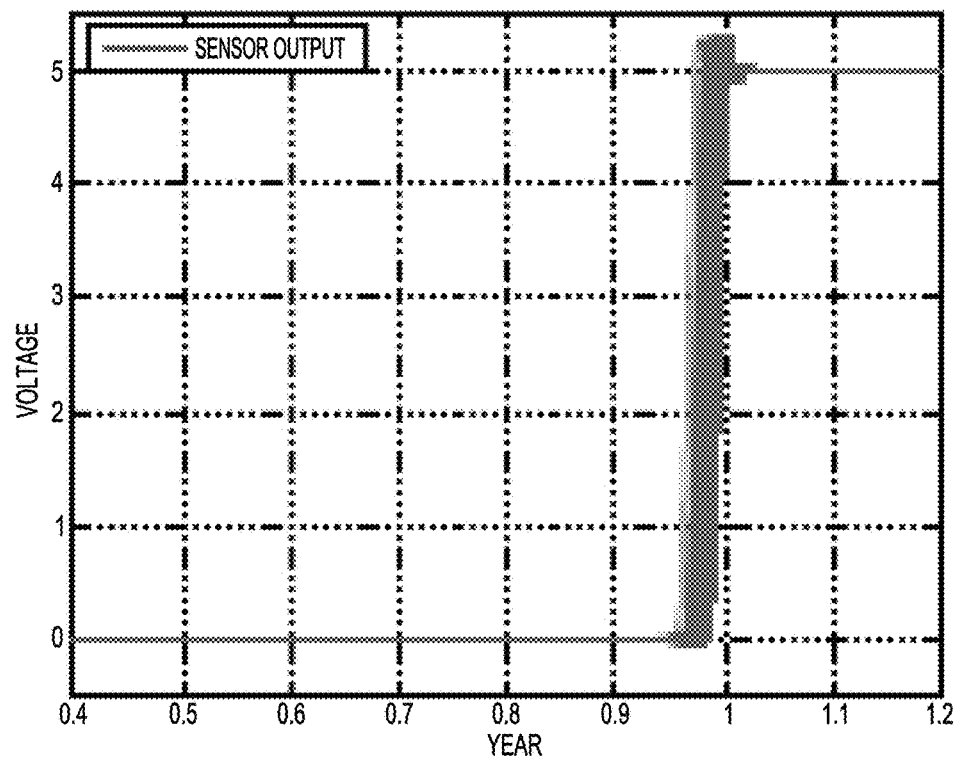

FIG. 8(a) shows the voltage waveforms at the two inputs of the ADC. In the beginning, the two inputs are clearly different. At the around 0.68 year, the voltages on the stress wires start to increase, which is also the nucleation time for the wires. Then, the voltage of the stressed wires starts to increase gradually until it runs across the 2.5 volts, and then the ADC output will change '1' from '0'. FIG. 8(b) shows that the ADC output will start to change from '0' (zero volts) to '1' (5 volts) around one year. As we can see, when the input voltage of stressed wires reaches the reference voltage, the output signal starts to change, which happens at one year in this case.

Figure 9:
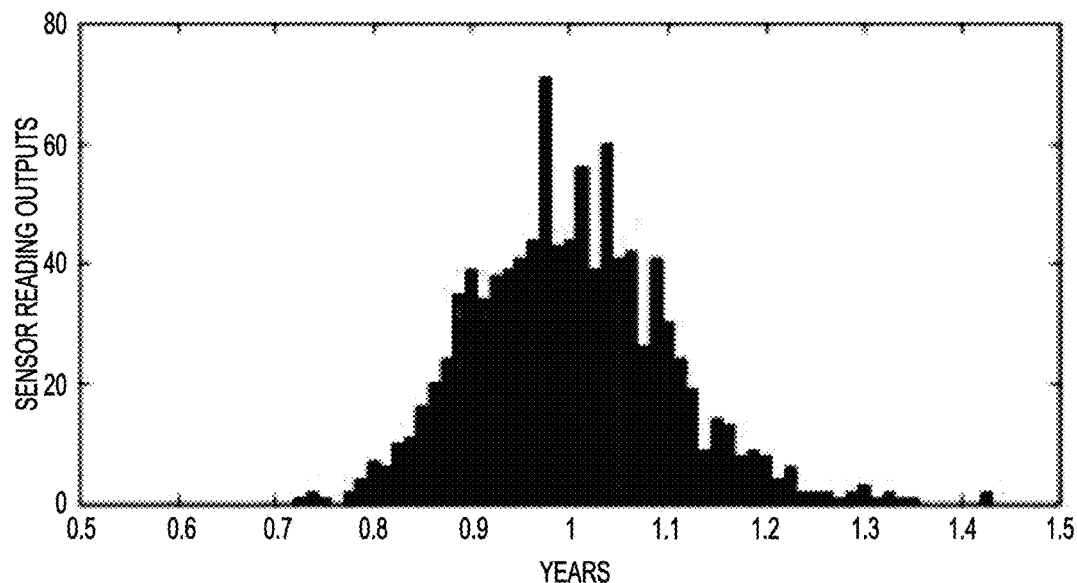
FIG. 9 shows statistical distribution of a lifetime of sensor wired detected according to an example of the invention.

FIG. 9 shows the statistical distribution of the lifetime detection results of the sensor wires at the output of the ADC. As we can see, the distribution is lognormal owing to the lognormal distribution of the nucleation time of the wires. This clearly shows that the proposed aging sensor work well as the failures of the wires can be very accurately detected around one year.

A new on-chip aging sensor is shown based on the EM-induced failure mechanisms to fast detect the recycled integrated circuits, which is one of the major hardware security issues facing the semiconductor industry. The new sensor is based on failure detections of DC current stressed metal wires to time the usage of chips over time. Compared with the existing ring-oscillator-based aging sensors, it can offer a simpler circuit implementation and smaller area footprints. It also provides a more accurate prediction of the chip usage time. The new aging sensor design is based on a newly proposed physics-based EM model. Experimental results show that the proposed aging sensor can accurately predict the targeted failure times in the presence of both inherent uncertainties. Our study also shows that more parallel wires will lead to more accurate statistical predictions at the cost of areas.

The counterfeiting integrated circuits (ICs) has become a major security threat for commercial and mission-critical systems. In addition to the huge economic impacts, they post significant security and safety threats on those systems. In this paper, we pro-pose a multi-functional on-chip sensor and the post-authentification policy for detecting and preventing the counterfeit ICs, including the recycled/remarked/out-of-spec ICs, as well as cloned and over-produced ICs. First, the new sensor adds an antifuse memory into existing aging sensors to reduce reference circuit related area overhead of those sensor circuits as initial electronic properties of sensor circuits are stored in a global database, accessed by unique chip via challenge-response pairs. Second, the new sensor can combine both the ring-oscillator based aging sensor with recently proposed electromigration (EM)-based aging sensor so that it can be effective for chip usage estimation for both short and long period. As a result, it can serve as more accurate timer for the chip to meter the usage of long period time, which can allow for timed services of some functionality of a chip in addition to detection of the recycled/remark ICs. Third, on top of the new sensor, we propose a post-fabrication authentication methodology to detect and prevent the non-defective counterfeit ICs. All the fabricated ICs will be uniquely registered and activated with a unique chip ID in a global database. The unique chip ID will be written into the antifuse memory during the registration process and the chip will be activated after this process. Simulation results show the advantage of the proposed multi-purpose sensor against the existing on-chip sensors in terms of functionality, detection coverage and usage time estimation range and accuracy.

The counterfeiting of integrated circuits (ICs) have become major problems in recent years, potentially impacting the security of electronic systems especially for military, aerospace, medical and other critical applications. Based on the 2008 report by the International Chamber of Commerce, the costs of the counterfeiting and piracy for G20 nations was as much as $775 billion per year and will grow to $1.7 trillion in 2015. The problem is getting worse due to deficiencies in the existing detection solutions and lack of effective avoidance mechanisms in place. Over the past couple of years, numerous reports have pointed to the counterfeiting issues in the U.S. electronics component supply chain. In addition to diminishing system dependability and usability, counterfeiting reduces the total revenue of companies from their research and development efforts, discourages innovation through the theft of intellectual properties (IPs), and produces low-quality products under established brand names.

Counterfeit ICs comes from different sources in the electronic supply chain. A counterfeit IC is not genuine one because it is an unauthorized copy; it does not conform to the original component manufacturer's (OCM) design, model, and/or performance; or it is not produced by the original component manufacturer or is produced by unauthorized contractors; it is an off-specification, defective, or used OCM product sold as "new" or working; it has incorrect or false markings and/or documentation. Therefore, counterfeit ICs can be classified into several major categories: (1) the recycled and remarked one, which is the most widely reported type of counterfeit parts; (2) the overproduced one, which is fabricated ones outside of contract by foundries; (3) the out of spec/defective one, which should be rejected during testing, but are stolen and sold on open markets; (4) The cloned one, which just copy the legal part by reverse engineering or illegal obtaining of IPs.

From detection techniques' perspective, the counterfeit ICs can also be categorized into defect ones and non-defect ones. The defect ones are those such as recycled/remarked ones and the out-of-spec/defective ones. Those counterfeit ICs will show some degrees of physical or electrical defects and anomalies due to aging and inherent defects from fabrications. Also the recycled ICs can cause reliability and security problems for many critical applications. Existing counterfeit detection techniques mainly focus on the detecting of the defect ones the as the recycled and used ICs account for the majority of the counterfeit components.

On the other hand, the non-defect ones such as the overproduced, cloned ones are unauthorized productions of IC without the legal license. These kind of ICs may be exactly same as the authorized ones. The non-defect ones, however, undercut the competition with the unlicensed ones, which can cause significant revenue loss and related job loss for the original IC and IP owners and OCMs. Unfortunately, existing detection techniques can only detect one type of those counterfeit ICs, not both. Therefore, it is urgently needed to develop new comprehensive, yet cost-effective, counterfeit IC detection techniques.

Review of Existing Detection Method

For defect types, especially recycled and remarked ICs, there exist many detection techniques, which can be classified into physical methods and electrical methods. Physical methods consist of in-coming inspection methods such as visual inspection, X-ray imaging, package analysis method such as laser scanning microscopy, delid method, and the material analysis method such as using Fourier trans-form infrared, and X-ray fluorescence. Electrical methods contain the parameter tests, function tests, built-in tests and structural tests. In general, physical methods can be applied to all part types, but some of the methods are destructive and take hours to test. As a result, sampling is required to certify a batch of parts by observing a small number of parts. On the other hand, conventional electrical test methods are non-destructive and time efficient, yet they can be very expensive because such techniques are not necessarily designed for counterfeit detection.

One viable way for fast detect and effectively prevent the recycled chip is to insert a lightweight aging detecting sensor, which can directly tell the usage of the chips and some early efforts have been explored.

Method in designed the ring-oscillator (RO)-based aging sensor that relies on the aging effects of MOSFETs to change a RO frequency in comparison with the reference one embedded in the chip. As the chip ages owing to the wear-out mechanisms such as negative biased temperature instability (NBTI) and hot carrier injection (HCI), the shift threshold voltage of MOSFET devices, thus the frequency of RO indicates the level of aging, and provides a simple readout of the value. However, this method can only give very rough estimation of the usage age of the chip as the shift of the frequency depends on many factors. In order to mitigate this problem, the antifuse (AF)-based sensor was developed. The AF-based sensor essentially is a counter, which counts the clocks or derivatives of the clock events to log the usage of the chip. The antifuse memory is used to make sure the data in the count will not be erased or altered by attackers. However, the AF-based sensors suffer large area overhead especially when more accurate usage is required. Another problem with this method is that it may not reflect the true aging-dependent usage of a chip. For instance, it will log the same usage time for a chip for different on-chip temperatures, however, which can have dramatically impacts on the aging effects from electromigration, NBTI and HCI. Recently, on-chip aging sensor based on the electromigration (EM) failure mechanism of interconnect wires has been proposed [10]. The main advantage of EM-based aging sensor over RO-based aging sensor is that it can provide more accurate usage time estimation especially over longer period of time. The design is also simple and light-weighted with small area and power overhead. But the EM-based sensor has more area overhead for estimation of short period time of usage as it needs longer interconnect wires.

For detection of non-defective counterfeit ICs, existing physical, electrical and aging sensor based methods will not be effective as there is no traceable properties can be detected. One potential solution is to have a post-fabrication authentication process in which, each IC will be uniquely registered into a global database using challenge-response pairs after fabrication and testing. The end users can verify the ICs for proper registration later. This post-fabrication authentication process is similar to the passive hardware metering method, which enables the design house to achieve post-fabrication control of the produced ICs. However, those methods cannot detect the recycled and used ICs.

We develop an innovative multi-functional on-chip sensor and the related post-fabrication authentication methodology for detecting and preventing the counterfeit ICs. The proposed on-chip sensor can detect recycled/remarked/out-of-spec chips, as well as cloned and over-produced ICs. It can serve as a central on-chip security hardware IP for counterfeit IC detection, on-chip timer and post-fabrication authentication and even activation module for ICs. Our new on-chip sensor has the following features:

The new on-chip sensor combines an antifuse memory block, which is one-time programmable (OTP), with existing aging sensors. The memory block will not be used as a counter as in the existing methods. Instead, it will store unique chip ID, time stamp of activation, and other important chip assets, which will be encrypted against tampering and can be verified by challenge-response pairs.

Second, the new on-chip sensor combines the two types of aging sensors to detect both short-term and long-term aging effects so that it can be effective and area-efficient for both cases. The RO-based sensor is more effective for short-timer usage detection and the EM-based aging sensor is more accurate for long term usage detection. The EM-based aging sensor exploits the natural aging/failure mechanism of interconnect wires to time the aging of the chip. It can serve as more accurate timer for the chip to meter the usage of long period time. As a result, it can enable timed service for some functionality of a chip and can also avoid the over-usage of an authorized period for a chip or a system for certain security requirements. On the other hand, it can use only one of two sensors also based on the applications.

Based on the new on-chip sensor, we propose a post-fabrication authentication methodology to detect and prevent the non-detective counterfeit ICs. All the fabricated ICs will be uniquely registered and activated with a unique chip ID in a global database. The unique chip ID will be written into the antifuse memory during registration process and chip will be activated after this process. In this way, it can prevent the cloned and over-produced ICs. In addition, it can get rid of the reference circuits in existing aging sensor designs as the initial electronic properties of the sensor circuits can be stored in the global database as well.

Simulated results shows the advantage of the proposed multi-purpose sensor against the existing on-chip sensors in terms of functionality, detection coverage, usage time estimation range and accuracy.

The Proposed On-Chip Sensor Circuit

Figure 10:
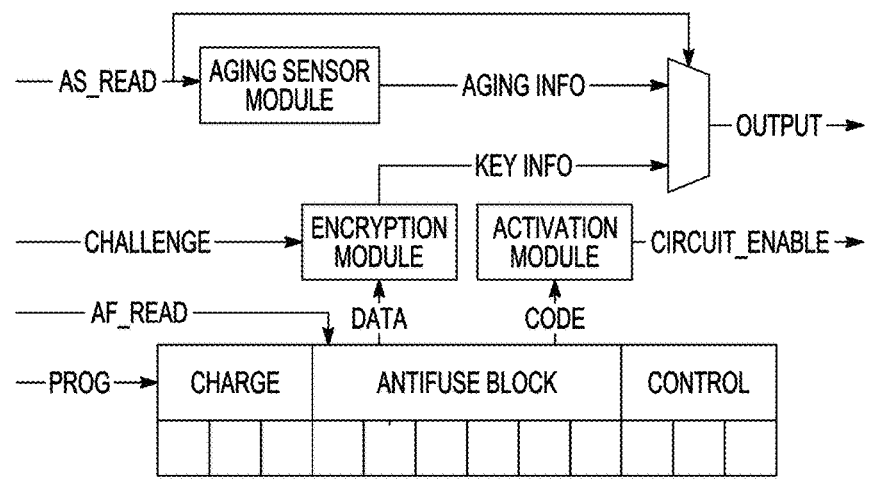
FIG. 10 shows architecture of a chip sensor according to an example of the invention.

In this section, we present the architecture of proposed on-chip sensor circuit, which consists of one antifuse memory block, one aging sensor module, one encryption module and one activation module as shown in FIG. 10. Each module will be discussed in detail in the following sections.

Antifuse Memory Block

An antifuse is an electrical device which performs the opposite function to a fuse. An antifuse starts with a high resistance and is designed to permanently create an electrically conductive path (typically when the voltage across the antifuse exceeds a certain level). It is an OTP memory technology. The antifuse memory is a type of read-only memory (ROM) meaning the data in them is permanent and cannot be changed. Antifuse is non-volatile, area and power efficient and has high reliability.

Most importantly, antifuse is confidential. Before and after programming, the change on antifuse is extremely small, usually within tens of nanometers. In addition, there are thousands, even millions of antifuse in one component. So the reverse engineering is almost impossible. As a result, it is ideal for storage the unique chip ID and activation time in the encrypted form. Additional, since the antifuse memory is on-chip, additional system design measures may be taken to make the device tamper-proof, such as password protecting the antifuse memory within the system chip. This newer memory technology provides unprecedented physical layer security. The antifuse memory block is used to store the unique key and other assets for each chip. The antifuse memories are programmed in a programming environment with relative high voltage. Therefore, integrated charge pumps are used to provide sufficiently high voltage in embedded antifuse memories. We use existing antifuse blocks instead of designing a new one.

Aging Sensor Module

Two different aging sensors to identify recycled ICs are used in this aging sensor module. The RO-based sensor is based on the aging effects on RO. The usage time can be detected by degraded RO frequency. The EM-based sensor relies on the EM aging effects on interconnect wires. The resistance change of the stressed wires can be used to estimate the chip usage time. The RO-based aging sensor is used to detect short-term aging while the EM-based aging sensor is used to detect long-term aging. In addition, the EM-based aging sensor can serve as a timer which can be used to disable the chip after a certain time. The two aging sensors will be discussed in detail in the following sections.

Figure 11:
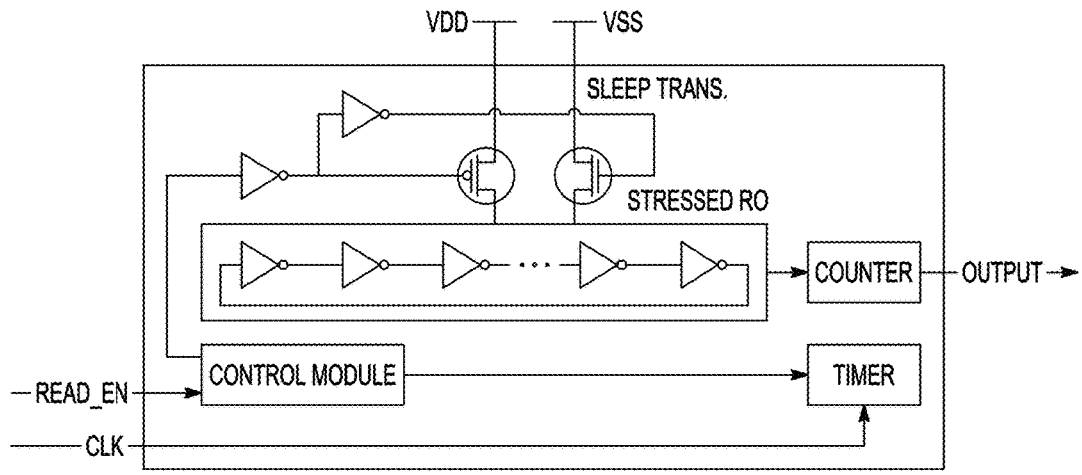
FIG. 11 shows structure of an RO aging sensor according to an example of the invention.
Figure 12:
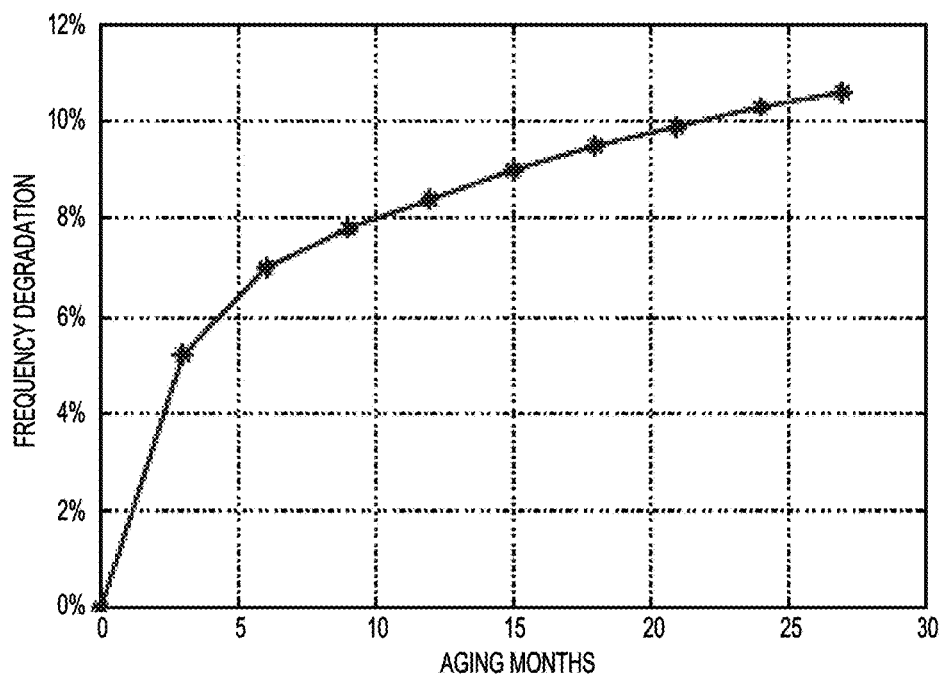
FIG. 12 shows frequency degradation of a 5-stages RO according to an example of the invention.
Figure 13A:
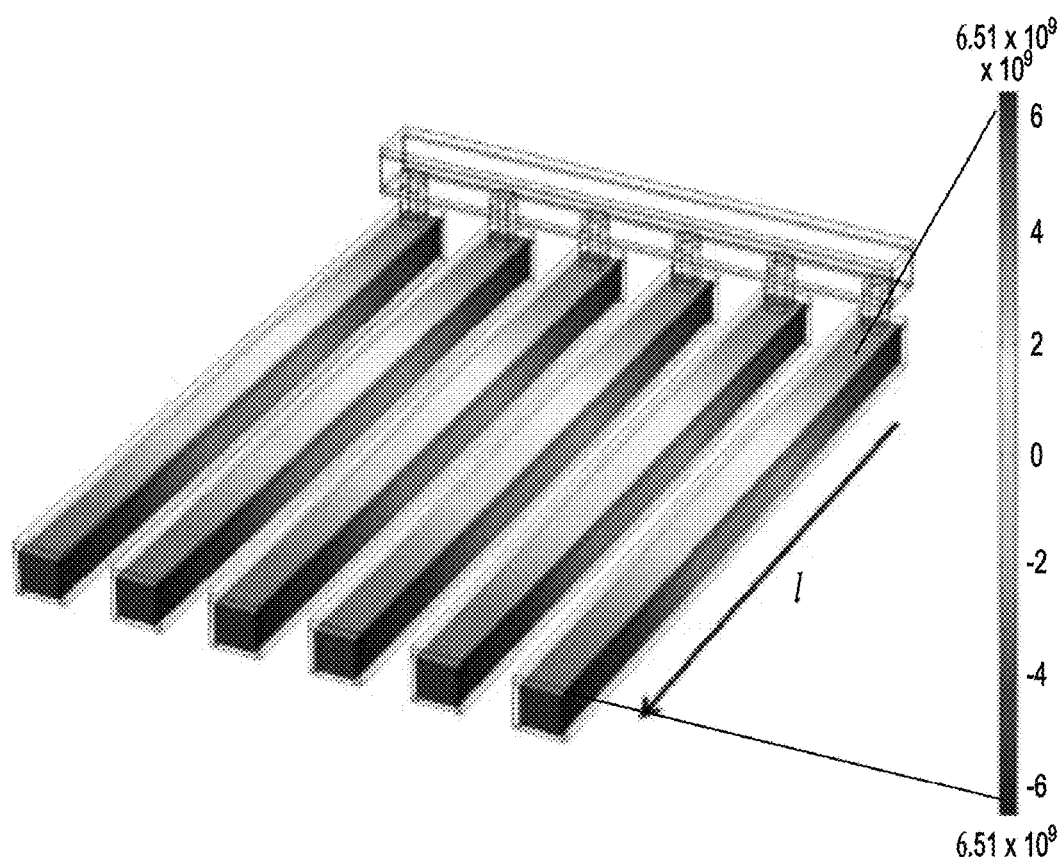
FIGS. 13A-13D show structure of an EM aging sensor according to an example of the invention.
Figure 13B:
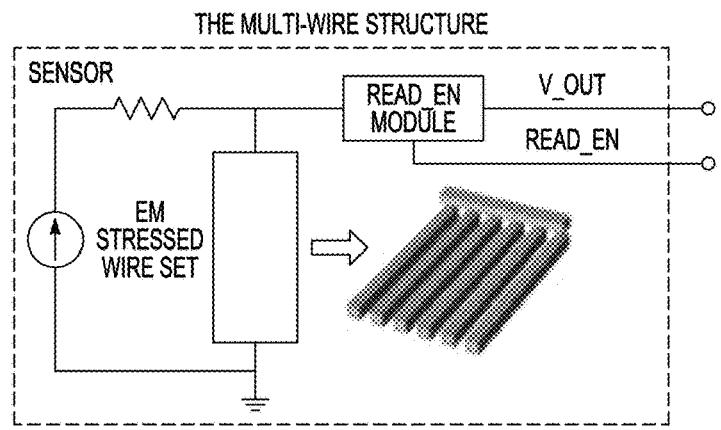
Figure 13C:
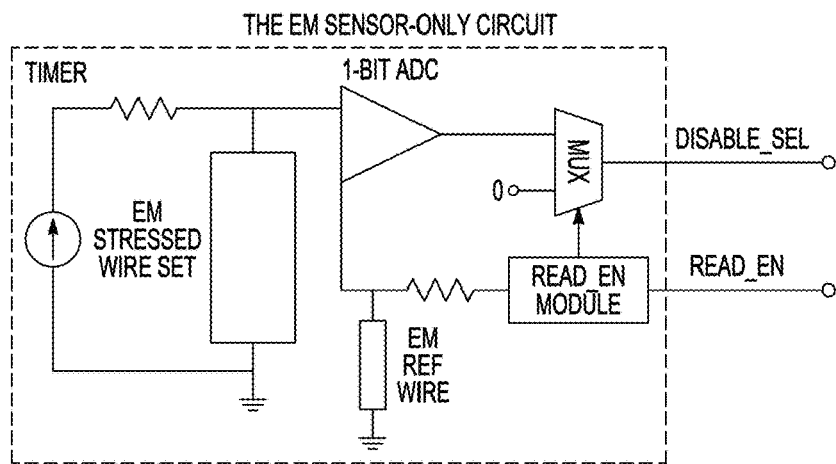
Figure 13D:
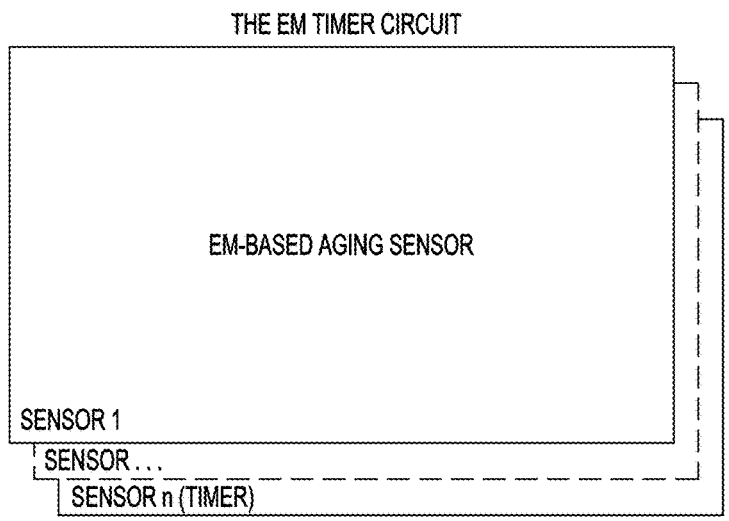

RO-Based Aging Sensor:

In the new sensor design, a new RO-based sensor is shown in FIG. 11. The new RO-based sensor only has one RO (compared to the two in other works, as the reference frequency will be stored in the design house database and can be assessed when the chip ID is read back by challenge-response pairs during the authentification process. The details of the whole flow will be discussed in the following section. FIG. 12 shows the typical frequency change over time for the RO-based sensor. As we can see, as time goes by, the frequency change rate goes down, which means that the sensitive of frequency change become smaller and it will more difficult and less accurate to estimate usage time based on the frequency changes for a long period of time.

EM-Based Aging Sensor:

FIG. 13 shows the schematic of the proposed EM-based sensor. FIG. 13(*a*) is the multi-wire structure to be stressed for a specific time in one sensor. The EM-based sensor has two versions. One version is aging sensor shown FIG. 13(*b*). In this case, we have a group of wires connected in parallel and stressed by DC current. The current densities in the wires are constant so that the wires will be nucleated at a specific time (e.g., one year or 10 years). The initial resistance of the wires will be stored in the design house database as a reference. When the resistance of wires changes by 10%, it can be counted as the failure and time difference between the activation time and current time is the usage time. Another version of the EM-based sensor is the timer version as shown FIG. 13(c). In this case, the reference wire, which has the same geometry as the stressed wires is used. The sensor can output the signal when the wire resistance change significantly (by 10%). The signal can be used to lock the chip or lock certain functions of the chip for timed-service of the chip or the system.

Encryption and Activation Module

The encryption module is used to encrypt the data from antifuse blocks with the challenge from the design house database. This module can be any existing encryption module, e.g., AES method. It is used to make sure the key information in the antifuse block cannot be directly accessed by any adversary.

The proposed on-chip sensor also allows one-time activation of a chip or certain chip functions. This is achieved by the activation module. Once the chip passed the post-fabrication testing, design house can write the key into the anti-fuse blocks. There are many ways to implement the chip-level activation process. For instance, we check the parity of the bits of the stored key in anti-fuse memory. We can also check number of zeros or number of ones as well (bit stream written into antifuse memory needs to enforce some properties in this case). The checking circuit inside the activation module can be obfuscated for further protection. The output of the activation module can drive a randomly scatted XOR gate in a chip to enable the unlocking process. In this way, it is difficult to modify layout by counterfeiters.

The Proposed Counterfeit IC Detection Methodology

In this section, we present the proposed overall counterfeit IC detection methodology and the IC authentification flow based on our on-chip sensor with antifuse memory.

Figure 14:
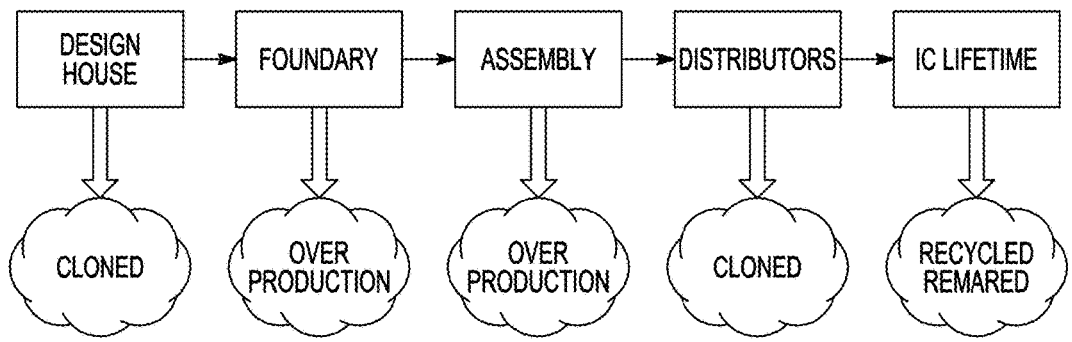
FIG. 14 shows electronic component supply chain and vulnerabilities according to an example of the invention.

FIG. 14 shows a typical lifetime process that an IC goes through, which include the design, fabrication, assembly, distribution, usage in the system until the end of its life. As one can see, there are vulnerabilities associated with each step in this supply chain. In the design stage, an IP can be stolen and cloned. In the fabrication process, an IC can be overproduced. In the assembly phase, out-of-spec/defective ICs can be sold to open market by an untrusted assembly. Illegal activities during distribution, in-the-system (lifetime) may bring different types of counterfeits back into the supply chain (recycled, remarked, etc.).

Figure 15:
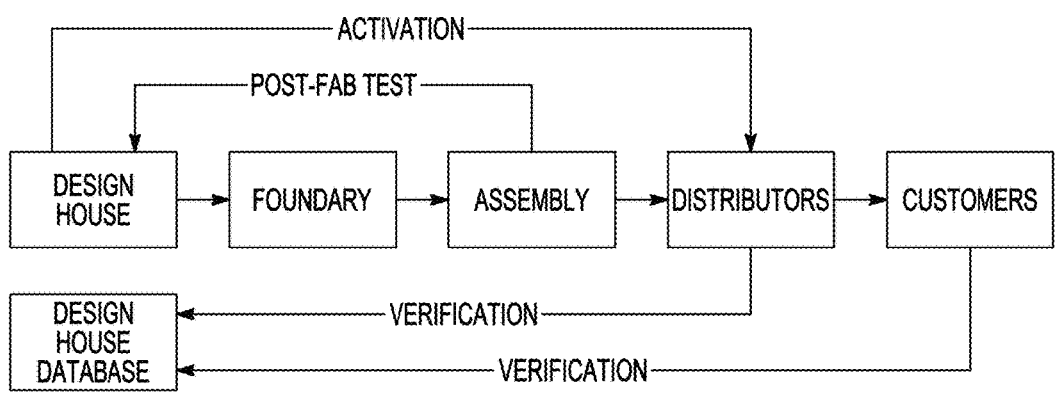
FIG. 15 shows a proposed supply chain with post-fabrication authentication according to an example of the invention.
Figure 16:
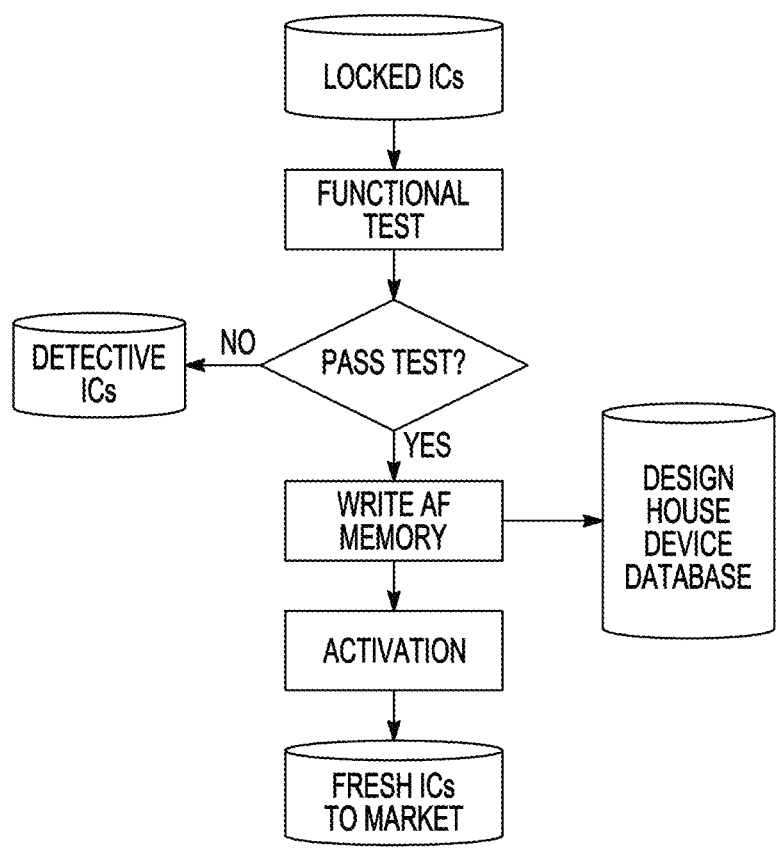
FIG. 16 shows a flow diagram of post-fabrication authentication according to an example of the invention.

To detect the all non-defective counterfeit ICs, we propose a new supply chain flow with post-fabrication authentification process as shown in FIG. 15. Basically, one needs to break the flow from assembly to the distribution. As shown in FIG. 16, once chips have been tested and packaged in the assembly stage, they will be sent back to the design house. After a functional test, for the non-defective ICs, a unique chip ID, activation time and other assets will be written into the antifuse memory in the on-chip sensor. And the initial aging reference properties will be stored into the design house global database for future verification. All the information cannot be directly accessed and will be encrypted using a standard cryptographic method to prevent the attack and tampering. Also during this process, the design house can activate the locked chip, which will not work after the fabrication process, using the unique content in the antifuse memory. In this way, the design house can have better control of the ICs to prevent cloning and other unauthorized use.

Figure 17:
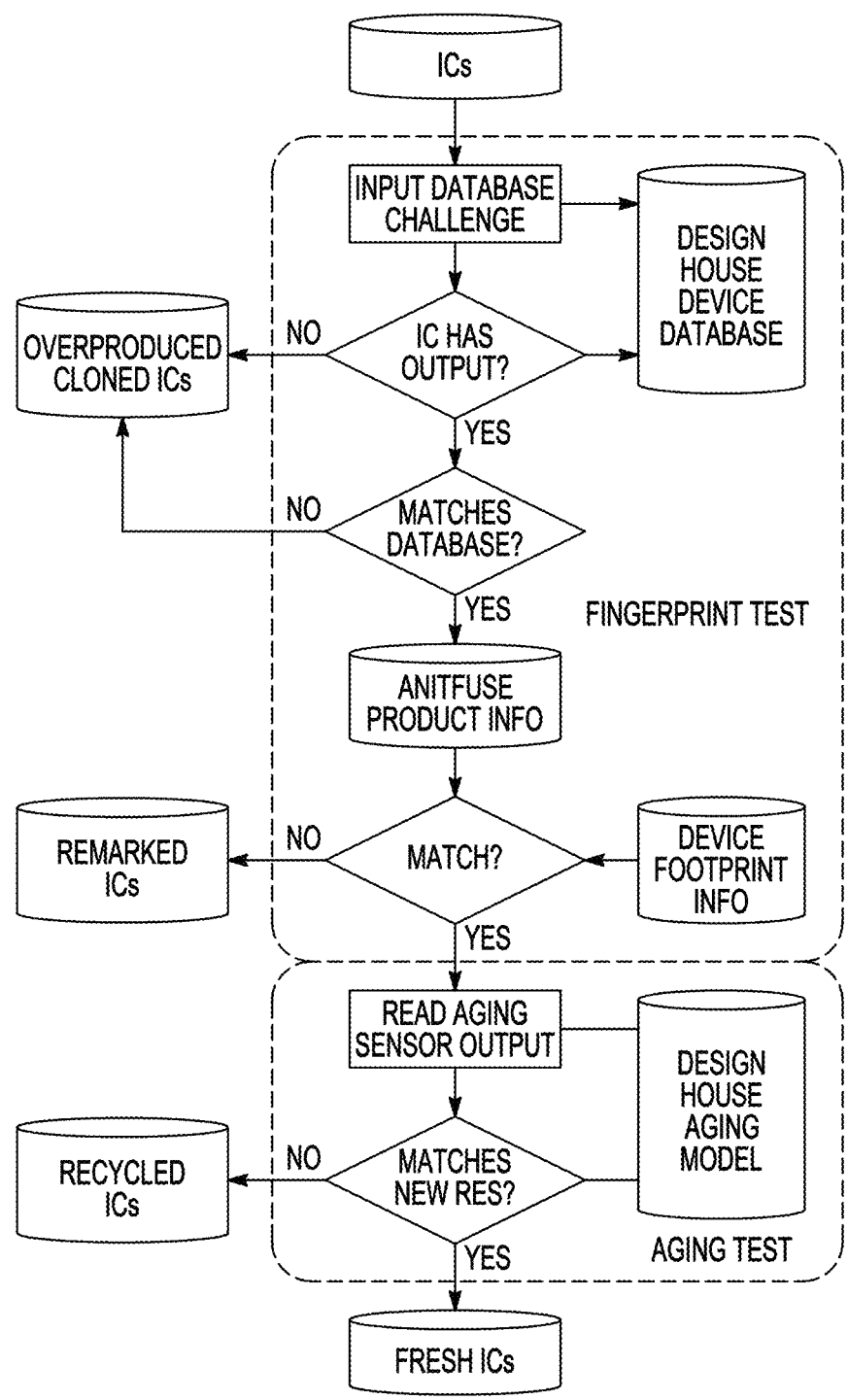
FIG. 17 shows a flow diagram of a comprehensive detection methodology for counterfeit ICs according to an example of the invention.

FIG. 17 shows the proposed comprehensive detection policy for counterfeit ICs. In general, a newly fabricated chip needs to pass two tests to be proved as a fresh and authentic IC. The first test is called fingerprint test. The design house device database generates a random challenge which can be input into the IC. If the IC cannot generate any response or just output an incorrect response, then it hasn't taken the official design house antifuse activation. It means this IC never comes back to the design house after fabrication. So it can be detected as overproduced or cloned IC. If the response of the IC matches the information in the design house database, then we can get its production information. By comparing the antifuse production information and the device footprint information, it's easy to detect it's a remarked IC or not. The second test is called aging test. This test is performed to detect recycled or used IC or tell the user the estimated usage time of the chip. By reading the aging sensor output, we can detect if it's recycled IC or not. Based on the aging model of the aging sensors employed and aging output, we can determine time usage of the chip accurately.

Numerical Results and Discussions

In this section, we first summarize the feature comparison among different sensors, then we will present the simulated results of the RO-based and EM-based sensors. The performance and overhead analysis will be discussed.

The Feature and Function Comparison Among Different Sensors:

Table I summarizes the major feature comparison among the RO-based, EM-based and the proposed hybrid aging sensor.

TABLE I

| AGING SENSOR COMPARISON | | | |
|---|---|---|---|
| Feature | RO | EM | Proposed |
| Short-term usage accuracy | high | low | high |
| Long-term usage accuracy | low | high | high |
| Post-fabrication auth | no | no | yes |
| Detect closed and over-produced ICs | no | no | yes |
| Reference circuit | needed | needed | not needed |
| Activation | no | no | yes |
| Timed-service | no | no | yes |

The RO-based sensor has high short-term usage accuracy but low long-term usage accuracy. The EM-based sensor has high long-term usage accuracy if we use multiple stressed wires. However, its design is not good for short-term recycled IC detection. Our proposed hybrid aging sensor can maintain high accuracy for both short- and long-term recycled IC detection. The proposed sensor can also allow post-fabrication authentification to detect cloned and over-produced ICs. It also allows activation of the chip and timed services for ICs when it is used as on-chip timer.

Results for RO-Based Aging Sensor

The RO-based aging sensor has been implemented and simulated using HSPICE MOSRA from Synopsys. In our implementation, we selected 7-stage and 15-stage ROs to compare the results. In order to model the variation, we performed Monte Carlo (MC) simulation with 1,000 samples of the RO in HSPICE.

We considered two process variations to investigate the impact of variation on the detection of the recycled ICs. Table II shows the different process variations used in our simulation. RO-based sensors with 7-stage and 15-stage ROs are simulated at 25° C. with PV0 and PV1. PV0 represents the expected process variation between ROs while PV1 is the worst-case scenario. Thousand sensors are generated using MC simulation by HSPICE and the total aging time is set at 15 months with a 3-month step.

TABLE II

PROCESS VARIATIONS USED

| | Inter-die | | | Intra-die | | |
|---|---|---|---|---|---|---|
| | Vth(%) | L(%) | Tox(%) | Vth(%) | L(%) | Tox(%) |
| PV0 | 5 | 5 | 2 | 5 | 5 | 1 |
| PV1 | 20 | 20 | 6 | 10 | 10 | 3 |

FIG. 18 shows the simulation results for the RO-based aging sensor. The x-axis represents the frequency difference (fdiff=finit−fstressed) between the initial value and the stressed RO. Note that we don't need reference RO because we store the initial frequency in the global database. The y-axis represents the frequency of occurrence. The legend in the figures denotes the aging time (for example, AT=3 M denotes the RO is aged for 3 months). The green distribution represents the fdiff distribution for the new ICs where the RO has not been aged and is centered at 0 MHz. The light blue and dark blue distributions represent 3 months and 15 months of aging respectively. It is clear that aging shifts the distributions to the right as the stressed RO has aged more and become slower resulting in the right shift of fdiff distribution.

Figure 18A:
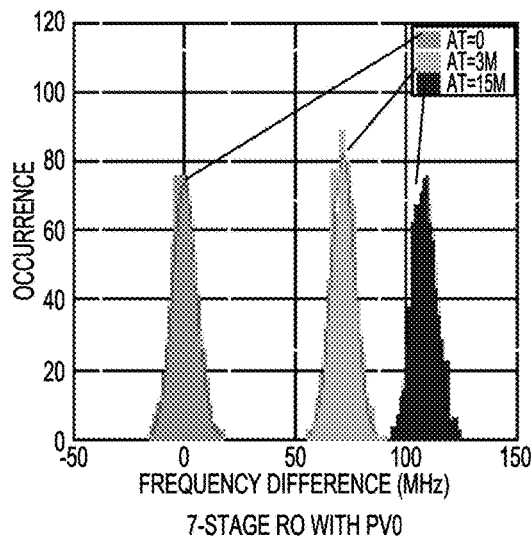
FIGS. 18A-18D show data for process variation impacts on frequency spreading and recycled IC detection probability according to an example of the invention.

We can clearly identify recycled ICs when the two distributions (T=0 and T=3, 15 M) do not overlap with one another. In FIG. 18(a), after being used for 3 months, the stressed RO suffers from aging effects and its frequency became lower. The lowest frequency difference between the new and the stressed ROs is larger than the largest frequency difference present in the new IC set. Therefore, the recycled IC detection rate for ICs aged for 3 months or longer is 100%. At 15 months, the frequency differences between the new and the stressed ROs can be larger.

Figure 18B:
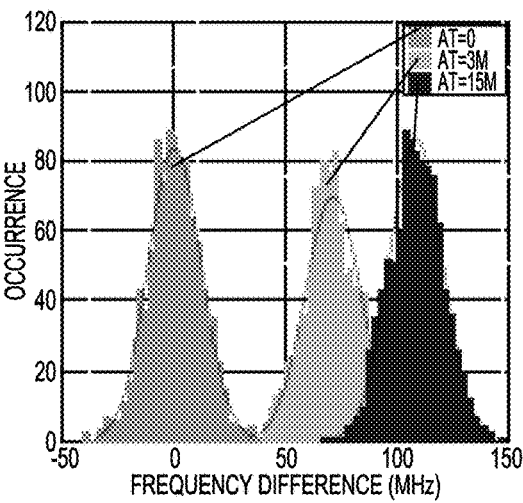

FIG. 18(b) shows the frequency difference occurrence rate between the 7-stage new and stressed ROs with process variations PV1. Moving from PV0 to PV1, interdie and intradie variations both become larger. As process variation increases, the variance in fdiff grows, which results in an overlap between 0 and 3.15 M distributions. In this case, we should expect higher mis-prediction rates.

Figure 18C:
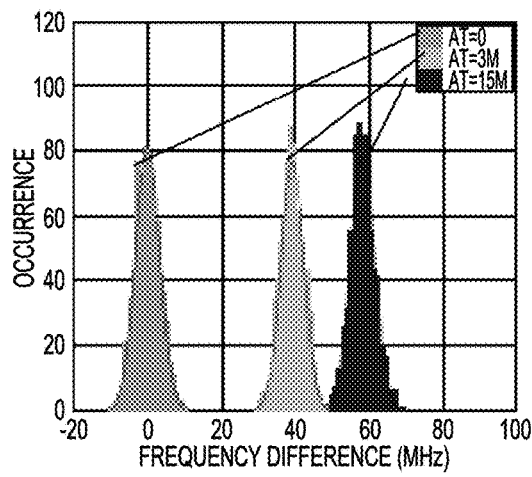
Figure 18D:
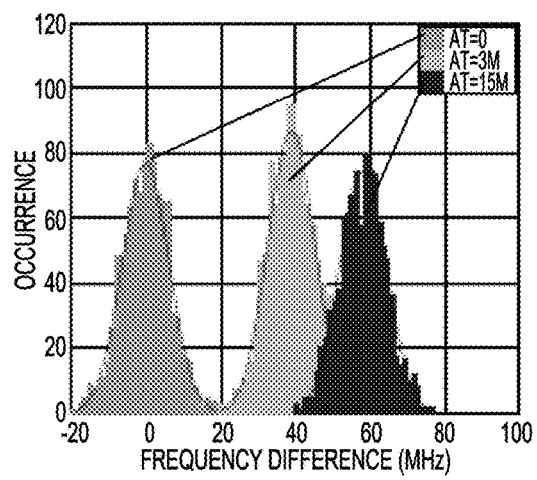
Figure 19A:
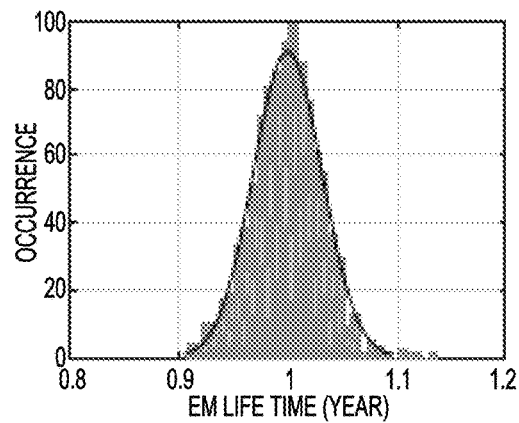
FIGS. 19A-19D show a statistical study of stressed wire set with different wire numbers according to an example of the invention.
Figure 19B:
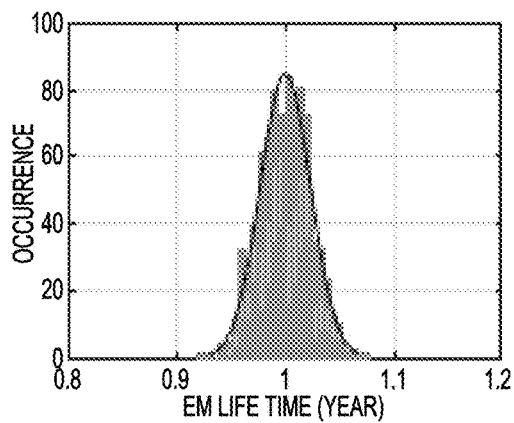
Figure 19C:
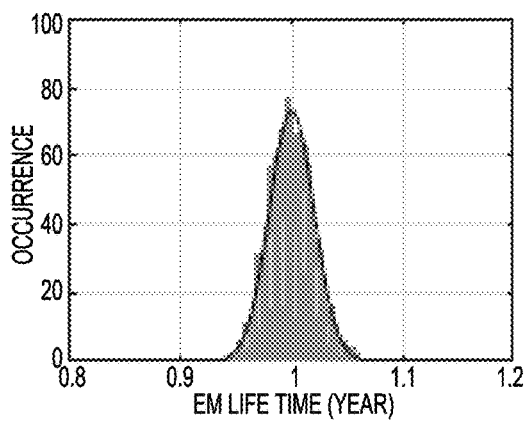
Figure 19D:
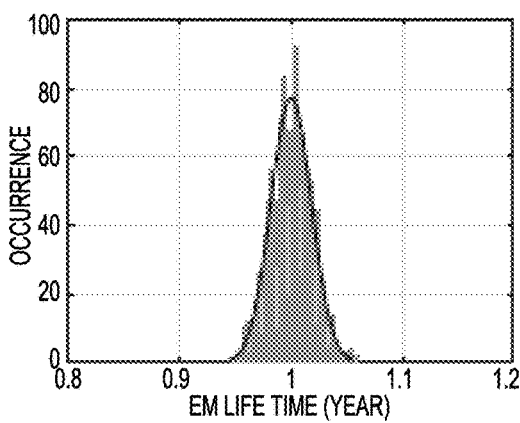

The simulation results for 15-stage ROs using same process variations are shown in FIG. 18(c) and FIG. 18(d). Comparing to the 7-stage ROs, the frequency difference between aged and new ICs is smaller because we use the larger stage ROs. Although it impacts the absolute value of the frequency difference, the detection rate will not be impacted significantly.

Results for EM-Based Aging Sensor

The proposed EM-based aging sensor circuit has been designed and validated using SPICE simulation. We performed 1000 Monte Carlo simulation considering the variation of the failure time for the stressed wires. The failure time can be defined as the time when the wire resistance increases 10% of its value, which can be predicted by the physical-based EM-model.

To verify the effects of aging on an EM-based aging sensor, we performed 1,000 MC simulation. The simulation is conducted using HSPICE and MATLAB with the physical-based EM-model. The EM stressed wire sets are composed of 1, 3, 6 and 10 wires which will fail around one year. The EM failure time follows lognormal distribution.

The 1000 MC simulation results of the EM-based aging sensor are shown in FIG. 19. The variance of the lognormal distribution is set to 0.001. With 0.001 variance, we can see that with one wire, the EM lifetime will fall into ±10% lifetime mean with 99.83% chance and into ±5% lifetime mean with 88.64% chance. If we use 6 wires, we can have 100% chance to achieve ±10% life mean and 98.66% chance for ±5% life mean, which is good enough. As we can see, we can mitigate the failure time variations by increase the number of wires.

Figure 20A:
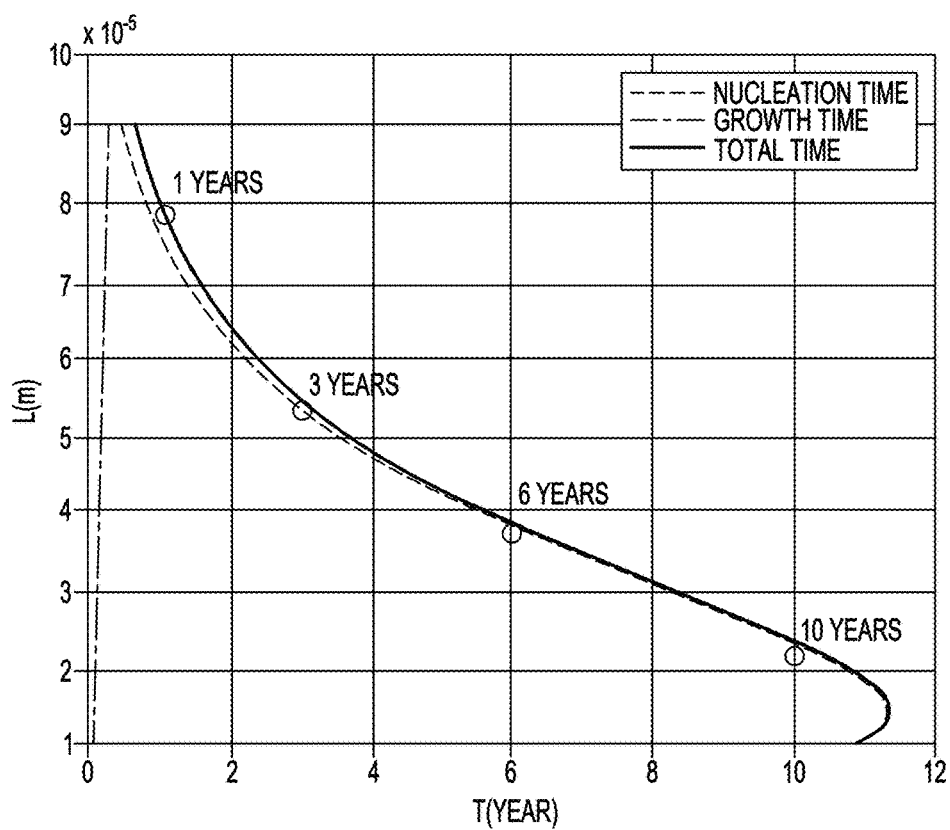
FIGS. 20A-20B show (a) length versus EM lifetime of a wire and (b) power consumption of stress wires versus wire length and current density according to an example of the invention.

FIG. 20(a) shows the relationship between wire length L and wire EM lifetime. The current density j is constant and set to $3*10^{10}$ A/m². We show both the nucleation time and the growth phase time predicted by the physics-based EM models. As we can see, the total lifetime increases with decreasing L (so does the area), which shows that shorter failure time will need larger area compared to the longer failure time.

Figure 20B:
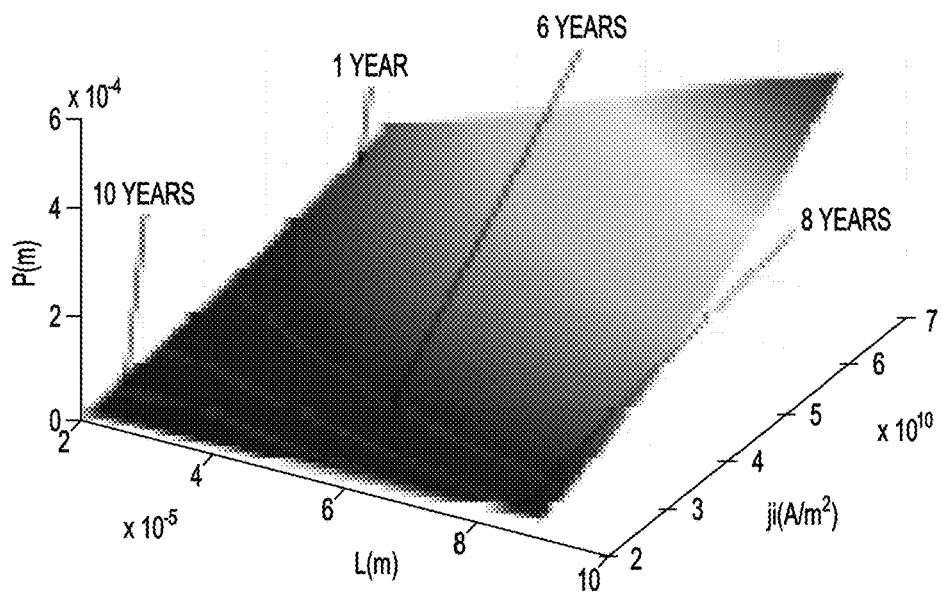

FIG. 20(b) shows the power values versus the possible wire length (L) and current density j. The 4 red curves show the possible L and j values for 1 year, 3 years, 6 years and 10 years. We can clearly see the trade-off between L (area) and power.

Performance Analysis and Comparison

Figure 21:
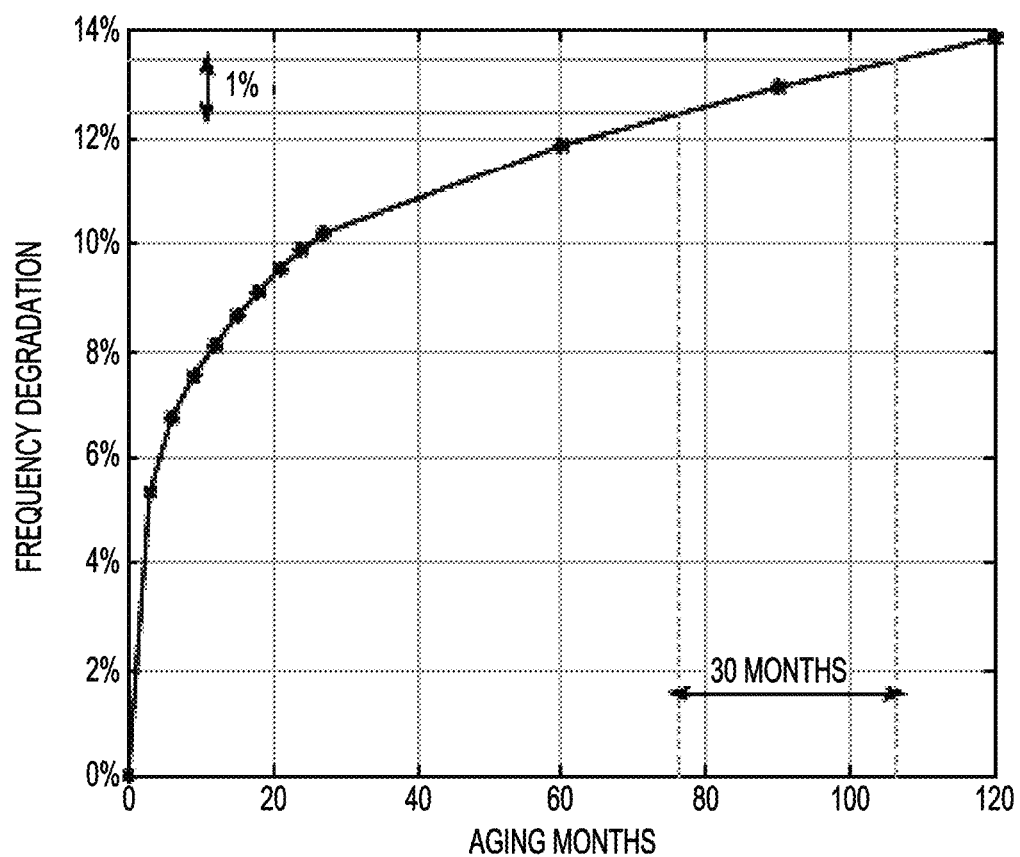
FIG. 21 shows an RO-based aging sensor error rate for long period time data according to an example of the invention.

Accuracy Study:

FIG. 21 shows the typical frequency change over a long period of time for a 5-stage RO-based sensor. As we can see, the frequency change rate is very high at the beginning, which is helpful to detect recycled ICs for a short period of time. However, as time goes by, the frequency change rate goes down, which means that it will be more difficult and less accurate to estimate usage time for a long period of time. Considering the process variances, 1% frequency difference can lead to a big estimated usage time region (30 months as shown in FIG. 21). So the RO-based sensor is not a good timer. So the EM-based sensor for long-term use is also area-efficient.

FIG. 21. The RO-based aging sensor error rate for long period time for long period use. In contrast, the EM-based sensor can be a good long-period time because of its accuracy. The estimated usage time region for a long period can be very small if we use multiple stressed wires. In addition, in FIG. 20(b), comparing to the 1-year EM-based sensor, the 10-years EM-based sensor has smaller L (area).

Area Overhead Study:

Bear in mind the hybird aging sensor can be inserted into commercial chips, which would easily detect the recycled ICs and show the age of the chip. Such a method is practical because the area overhead is small. The RO-based sensor only takes in invertors, where n is the number of stages in RO. Its area is equal to tens of NAND2 gates, which is negligible to the whole chip. An EM-based aging sensor with 10 stressed wires costs 100-500 um² with an SMIC 180 nm technology, which depends on the length of the wire. Assuming a total of 5 EM-based sensors, the overhead is only 0.01% of the 25,000,000 um² area available in a 5 mm×5 mm chip.

CONCLUSION

We have shown a multi-functional on-chip sensor and the corresponding methodology for detecting and authenticating the counterfeit ICs. The proposed on-chip sensor can detect many types of counterfeit ICs. The new on-chip sensor, which combines aging sensors with antifuse memory, can also serve as a central on-chip security hardware IP for counterfeit IC detection, on-chip timer, post-fabrication authentication and even activation module for ICs. On top of the new sensor hardware, we propose a post-fabrication authentication process to detect and prevent the non-defective counterfeit ICs. All the fabricated ICs will be uniquely registered and activated with a unique chip ID in a global database. The unique chip ID will be written into the anti-fused memory during the registration process and the chip will be activated after this process. Simulation results show the advantage of the proposed multi-purpose sensor against the existing on-chip sensors in terms of functionality, detection coverage and usage time estimation range and accuracy.

While a number of advantages of embodiments described herein are listed above, the list is not exhaustive. Other advantages of embodiments described above will be apparent to one of ordinary skill in the art, having read the present disclosure. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A chip, comprising:
   a chip age sensor; and
   an antifuse memory block including static information unique to the chip, wherein the chip age sensor includes both a short-term age sensor to detect aging over a number of months, and a separate long-term electromigration age sensor to detect aging over a number of years.

2. The chip of claim 1, wherein the short-term age sensor includes a ring oscillator age sensor.

3. The chip of claim 1, wherein the antifuse memory block includes a unique chip identification code.

4. The chip of claim 1, wherein the antifuse memory block includes a time stamp of activation.

5. The chip of claim 1, wherein the antifuse memory bloc includes initial electronic properties of the chip age sensor.

6. A chip, comprising:
   a chip age sensor, including;
   a plurality of conductors in parallel, each conductor having a length, wherein the plurality of conductors are configured to experience electrical stress during operation of the chip;
   a reference conductor also having the length;
   a test circuit to compare the reference conductor to the plurality of conductors after a time, and to detect an average electrical difference between the plurality of conductors and the reference conductor that relates to an amount of electrical stress over time; and
   an antifuse memory block including static information unique to the chip.

7. The chip of claim 6, wherein the chip age sensor further includes a ring oscillator age sensor.

8. The chip of claim 6, wherein the test circuit is configured to compare resistance changes in the plurality of conductors resulting from electromigration within the plurality of conductors.

9. The chip of claim 6, wherein the antifuse memory block includes initial resistance of the plurality of conductors.

10. A method, including:
    forming a chip age sensor on a chip at a manufacturing facility;
    forming an antifuse memory block on the chip at the manufacturing facility; and
    activating the chip at a customer facility, wherein activating the chip includes storing static information unique to the chip in the antifuse memory at the customer facility.

11. The method of claim 10, wherein activating the chip further includes storing the static information unique to the chip in a customer database.

12. The method of claim 10, wherein forming the chip age sensor includes forming a chip age sensor with both a short-term age sensor and a separate long-term age sensor.

13. The method of claim 12, wherein forming the short-term age sensor includes forming a ring oscillator age sensor.

14. The method of claim 12, wherein forming the long-term age sensor includes forming an electromigration age sensor.

15. The method of claim 10, wherein activating the chip includes storing a unique chip identification code in the antifuse memory block.

16. The method of claim 10, wherein activating the chip includes storing a time stamp of activation in the antifuse memory block.

17. The method of claim 10, wherein activating the chip includes storing initial electronic properties of the chip age sensor in the antifuse memory block.

* * * * *